(12) United States Patent
Najmaei et al.

(10) Patent No.: US 10,541,340 B2
(45) Date of Patent: Jan. 21, 2020

(54) 2D MATERIAL PHOTO-DETECTOR GAIN AND RESPONSIVITY CONTROL AND ENHANCEMENT THROUGH INDUCED INTERFACE TRAP DOPING

(71) Applicant: UNITED STATES GOVERNMENT AS REPRESENTED BY THE SECRETARY OF THE ARMY, Adelphi, MD (US)

(72) Inventors: Sina Najmaei, Laurel, MD (US); Madan Dubey, South River, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 115 days.

(21) Appl. No.: 15/657,291

(22) Filed: Jul. 24, 2017

(65) Prior Publication Data
US 2019/0027623 A1    Jan. 24, 2019

(51) Int. Cl.
*H01L 31/0352* (2006.01)
*H01L 31/032* (2006.01)
*H01L 31/18* (2006.01)

(52) U.S. Cl.
CPC ........ *H01L 31/0352* (2013.01); *H01L 31/032* (2013.01); *H01L 31/186* (2013.01)

(58) Field of Classification Search
None
See application file for complete search history.

(56) References Cited

U.S. PATENT DOCUMENTS 9,494,462 B2   11/2016   Griffith
9,647,753 B1    5/2017   Kurisu et al.

OTHER PUBLICATIONS

Zhang, H. et al., "Molybdenum disulfide (MoS.sub.2) as a broad-band saturable absorber for ultra-fast photonics", Mar. 20, 2014., Optics Express. DOI: 10.1364/OE.22.007249 (Year: 2014).*
Lee, C. et al., "Atomically thin p-n junctions with van der Waals heterointerfaces", Aug. 10, 2014., nature nanotechnology. DOI: 10.1038/NNANO.2014.150 (Year: 2014).*
Lin, J. et al., "Electron-Doping-Enhanced Trion Formation in Monolayer Molybdenum Disulfide Functionalized with Cesium Carbonate", May 1, 2014., ACSNano, DOI: 10.1021/nn501580c (Year: 2014).*
Park, H., et al., "Wide-Range Controllable n-Doping of Molybdenum Disulfide (MoS.sub.2) through Thermal and Optical Activation", Feb. 18, 2015., ACSNano, DOI: 10.1021/acsnano.5b00153 (Year: 2015).*

(Continued)

*Primary Examiner* — Cory W Eskridge
(74) *Attorney, Agent, or Firm* — Robert Thompson; Eric B. Compton

(57) ABSTRACT

A method for controlling any of a responsivity, response time, and trap characteristics of a two-dimensional (2D) material on a self-assembled monolayers (SAMs) device, the method including modifying a surface of an oxide substrate, in an atomic scale, to create the 2D material, wherein the modifying the surface includes modifying a level of impurities trapped in the surface and a doping level of the surface, and forming charge carrier traps at the surface, wherein a capture rate and an emission rate of the charge carrier is influenced by an exposure to a light signal, and wherein the exposure to the light signal further changes the doping level of the surface.

19 Claims, 23 Drawing Sheets

(56) References Cited

OTHER PUBLICATIONS

Ahmad, R., et al., "Functionalized Molybdenum Disulfide Nanosheets for 0D-2D Hybrid Nanostructures: Photoinduced Charge Transfer and Enhanced Photoresponse", Mar. 28, 2017., Journal of Physical Chemistry Letters, DOI: 10.1021/acs.jpclett.7b00243 (Year: 2017).*

Mak, K., et al. "The valley Hall effect in $MoS_2$ transistors", Jun. 27, 2014., Science, DOI: 10.1126/science.1249850 (Year: 2014).*

Najmaei, S. et al., "Enabling Ultrasensitive Photo-detection Through Control of Interface Properties in Molybdenum Disulfide Atomic Layers", Dec. 20, 2016., Scientific Reports, DOI: 10.1038/srep39465 (Year: 2016).*

* cited by examiner

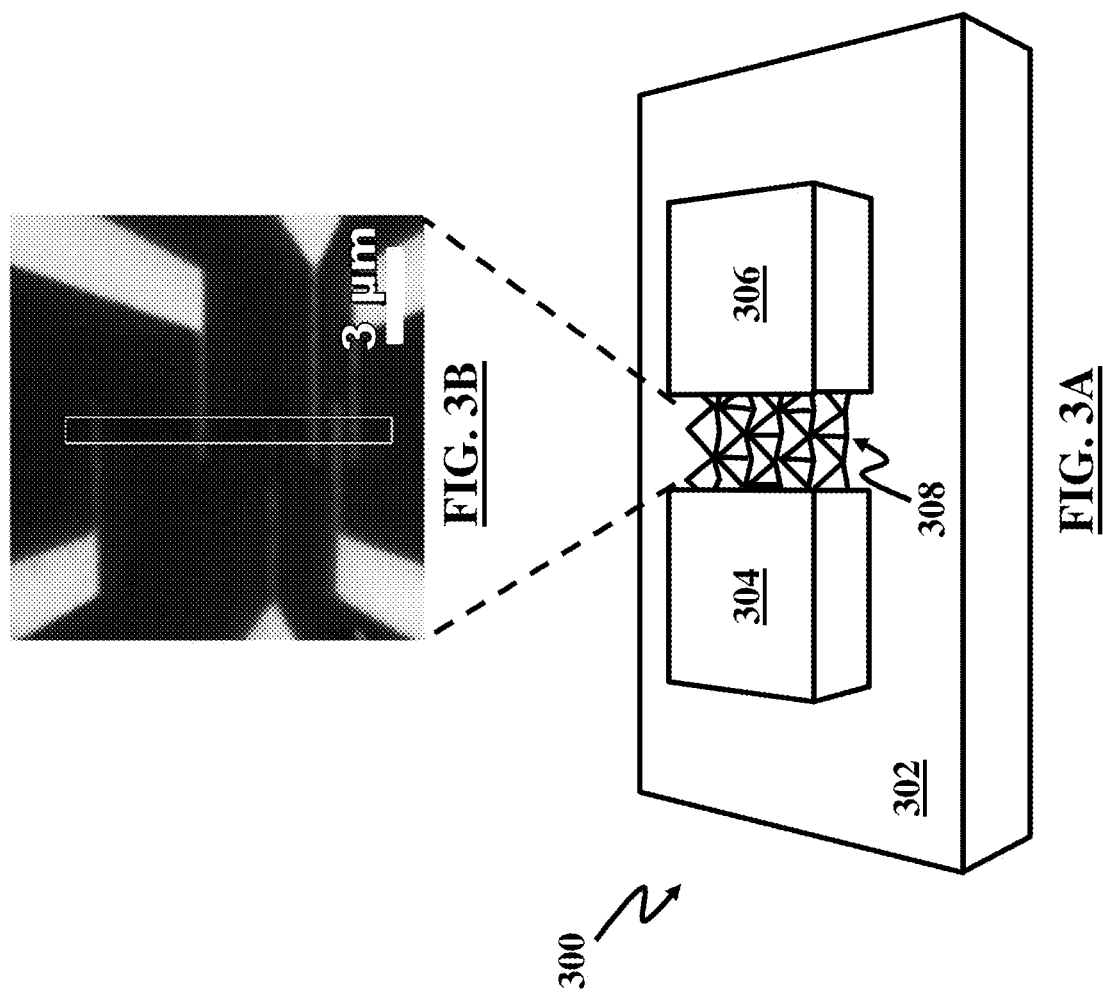

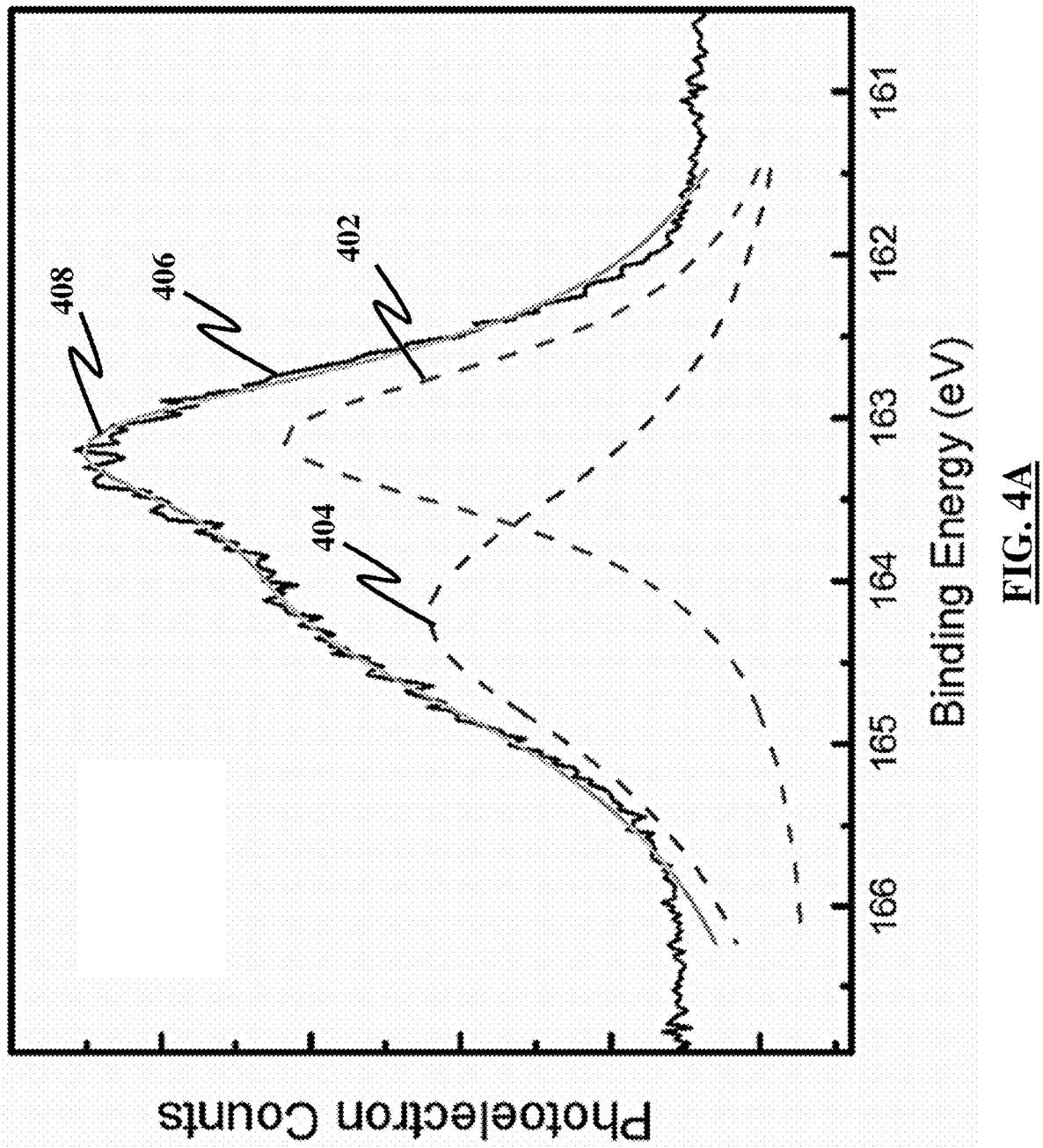

2D MATERIAL PHOTO-DETECTOR GAIN AND RESPONSIVITY CONTROL AND ENHANCEMENT THROUGH INDUCED INTERFACE TRAP DOPING

GOVERNMENT INTEREST

The embodiments herein may be manufactured, used, and/or licensed by or for the United States Government without the payment of royalties thereon.

BACKGROUND

Technical Field

The embodiments herein generally relate to photo-detector materials, and more particularly to gain and responsivity control in two-dimensional (2D) photo-detectors.

Description of the Related Art

The study of 2D materials, covering a wide spectrum of physics and applications, has inspired attention. The broad range of bandgap properties, strong light-matter interactions, significant spin-orbit entanglement, suitable electronic transport properties, and effective plasmonic interactions are among several explored research areas that motivate 2D optoelectronic applications. However, a comprehensive understanding of the 2D material device properties and light-matter interactions are important to any progress in this field. For example, it is desirable to be able to control gain and responsivity of a 2D photo-detector.

SUMMARY

In view of the foregoing, an embodiment herein provides a method for controlling any of a responsivity, response time, and trap characteristics of a 2D material on a self-assembled monolayers (SAMs) device, the method comprising modifying a surface of an oxide substrate, in an atomic scale, to create the 2D material, wherein the modifying of the surface comprises modifying a level of impurities trapped in the surface and a doping level of the surface, and forming charge carrier traps at the surface, wherein a capture rate and an emission rate of the charge carrier is influenced by an exposure to a light signal, and wherein the exposure to the light signal further changes the doping level of the surface.

The modification of the doping level may comprise changing a barrier height at an interface contact of the oxide substrate, wherein the changing of the barrier height may comprise a first charge trapping at a surface of the oxide substrate. The oxide substrate may comprise silicon oxide, and the silicon oxide may be grown on a silicon layer, wherein the modification of the doping level may further comprise a second charge trapping at a surface of the silicon layer.

The silicon layer and the silicon oxide may be exposed to the light signal in a visible frequency range, wherein the exposure to the light signal results in the change in the barrier height at a contact of the silicon layer and the silicon oxide, and wherein the barrier height change amplifies a current in the silicon layer and the silicon oxide. A responsivity of a photo-detector made using the 2D device may be greater or equal to approximately $4.5 \times 10^3$ A/W at approximately 7 V.

An embodiment herein provides a device comprising a semiconductor layer and an oxide layer grown on the semiconductor layer, wherein a surface of the oxide layer is modified in an atomic scale by modification of impurities trapped in the surface and a doping level of the surface, and forming charge carrier traps at the surface, wherein a capture rate and an emission rate of the charge carrier is influenced by an exposure to a light signal, wherein the exposure to the light signal further changes the doping level of the surface.

The modification of the doping level may comprise changing a barrier height at an interface contact of the oxide layer, and wherein the changing of the barrier height may comprise a first charge trapping at a surface of the oxide layer. The oxide layer may be grown on a semiconductor layer, and wherein the modification of doping level may further comprise a second charge trapping at a surface of the semiconductor layer. The semiconductor layer and the oxide layer may be exposed to the light signal in a visible frequency range, wherein the exposure to the light signal may result in the change in the barrier height at a contact of the semiconductor layer and the oxide layer, and wherein the barrier height change may amplify a current in the semiconductor layer and the oxide layer. A responsivity of a photo-detector made using the device may be greater or equal to approximately $4.5 \times 10^3$ A/W at approximately 7 V. The device may be any of a photo-detector, memory device, and a quantum computational device.

An embodiment herein provides a device comprising a silicon oxide layer, wherein a surface of the silicon oxide layer is treated by applying oxygen plasma for approximately five minutes, and the surface is modified by applying thiol-based organosilanes, and a molybdenum disulfide layer grown on the silicon oxide layer using chemical vapor deposition. The oxygen plasma may form hydroxyl on the silicon oxide layer, wherein the silicon oxide layer may be placed with a drop of organosilane precursor in a vacuum desiccator under approximate vacuum conditions of approximately 5 mBar at approximately 60° C. for approximately 2 hours.

A contact angle of the silicon oxide layer may be greater than or equal to approximately 65 degrees. The thiol-based organosilanes may comprise thiol-terminated (3-Mercapto-propyl) methyl dimethoxysilane ($CH_3Si(OCH_3)_{2(c)}H_{2(c)}H_{2(o)}H_2SH$). The silicon oxide layer may be grown on a baseline pristine and approximately 300 nm thick thermally oxidized P-type Si substrates. The device may be a photo-detector and the spacing between the $E^1_{2g}$ and the $A_{1g}$ Raman peaks of the device is approximately 20 $cm^{-1}$. The device may further comprise source and drain metal contacts connected to the molybdenum disulfide layer, wherein the metal contacts may be etched using an e-beam evaporation at approximately $5 \times 10^{-6}$ Torr. The metal contacts may be approximately 3 nm to approximately 50 nm thick Ti/Au. The device may be any of a photo-detector, memory device, and a quantum computational device.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 3A is a schematic diagram illustrating a device used for electronic and optoelectronic characterization according to an embodiment herein;

FIG. 3B is a schematic diagram illustrating an enlarged portion of a photo-detection layer according to an embodiment herein;

FIG. 4A is a graphical representation illustrating a S2p doublet peak from SAMs modified surfaces obtained using XPS Al $K_\alpha$ x-ray radiation according to an embodiment herein;

DETAILED DESCRIPTION

Figure 1:
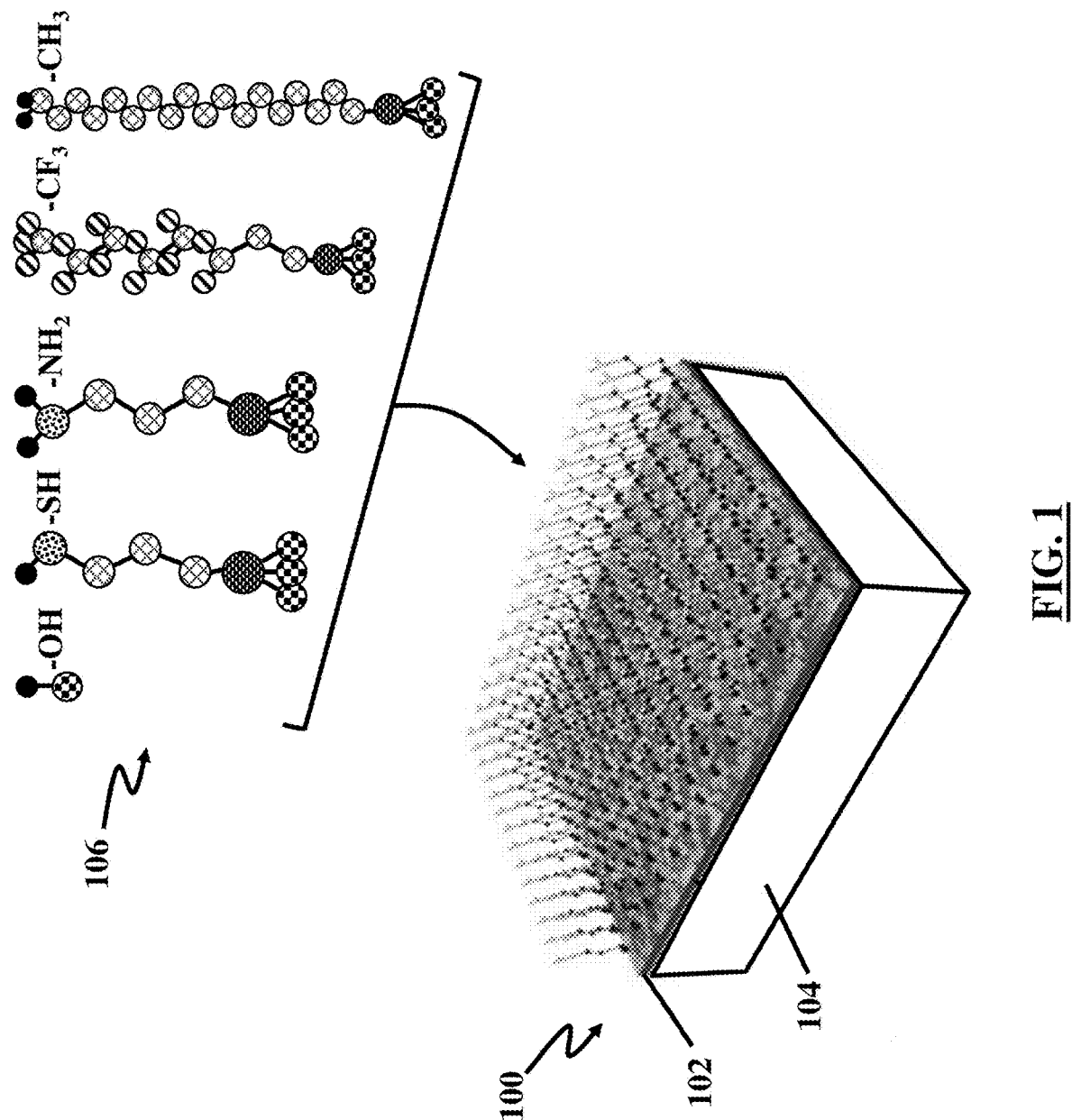
FIG. 1 is a schematic diagram illustrating a 2D photo-detector according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The photo-detector and phototransistor properties of devices made using transition metal dichalcogenides (TMIDs) show promising photo-detection efficiency and responsivities. The embodiments herein provide photocurrent generation and utilize device properties and incorporate the role of interfaces.

The large surface area and lack of dangling bonds in 2D materials may make their interfaces with 3D materials in device platforms unique. These interfaces may include the interface of the 2D materials with their substrate and the interface of the 2D materials and metal contacts. Substrate interface interactions may result in interfacial charge carrier scattering and carrier mobility changes in 2D materials. They can also result in strong exciton localizations and affect the photoluminescence response. Furthermore, interfacial design can be used to control and modify the 2D device properties.

An embodiment herein uses the charge carrier traps in 3D nanomaterials as a tool for control of photo-detector properties. For instance, ultrasensitive photo-detectors made of quantum dots with deliberately designed surface trap functionalization may be used in photo-detectors made of low dimensional material systems. The dynamic behavior of contact interface traps and the nature of charge carrier capture and escape can modify the contact barrier and potential levels in the device and alter its properties. Therefore, the design of traps and controlling their properties may be used in tailoring the properties of nanomaterial based photo-detectors. Since 2D materials have large surface-to-volume ratios, interface properties have high importance in their optoelectronics.

Some of the embodiments herein provide interface engineering in 2D atomic layers that can be used to selectively dope, induce carrier trapping, and modify the device properties in these materials. By creating traps and trap base doping, the embodiments herein control the contact barrier and thus responsivity of 2D photo-detectors.

Interface engineering strategies of the embodiments herein may be used for doping purposes and common patterned assembly strategies and can be used to localize the doping. The strategies in the embodiments herein can be used to develop sensors, photo-detectors, memory devices, and applications in logic circuits. Additionally, they can be used for systematic trapping of charge and photo-carriers. Combined with sufficient external control and actuation using other technologies such as magnetisms and plasmonics devices, the embodiments herein can be used for applications in any of quantum computing, quantum sensing, and control of quantum capacitance.

In an embodiment herein, the interfaces in devices made of two-dimensional materials such as molybdenum disulfide ($MoS_2$) can effectively control their optoelectronic performance. The embodiments herein provide for utilizing the role of substrate interfaces on the photo-detector properties of $MoS_2$ devices and utilizing its photocurrent properties on both silicon oxide ($SiO_2$) and self-assembled monolayer-modified substrates. In some embodiments, while the photoresponsivity of the devices may be enhanced through control of device interfaces, response times may moderately be compromised. This trade-off may be due to the changes in the electrical contact resistance at the device metal-semiconductor interface. The embodiments herein demonstrate that the formation of charge carrier traps at the interface can dominate the device photoresponse properties. The capture and emission rates of deeply trapped charge carriers in the substrate-semiconductor-metal regions are strongly influenced by exposure to light and can dynamically dope the contact regions and thus perturb the photo-detector properties. As a result, interface-modified photo-detectors have significantly lower dark-currents and higher on-currents. Through interfacial design, the embodiments herein achieve a device responsivity of $4.5 \times 10^3$ A/W at 7 V, which is indicative of the large signal gain in the devices and exemplifying an important design strategy that enables highly responsive two-dimensional photo-detectors.

Referring now to the drawings, and more particularly to FIGS. 1 through 10, where similar reference characters denote corresponding features consistently throughout the figures, there are shown preferred embodiments.

FIG. 1 is a schematic diagram illustrating use of self-assembled monolayers (SAMs) 100 for modification of oxide substrates surfaces ($SiO_2$ layer 102), grown on a silicon layer (Si layer 104), to tailor and change the interface properties of the $SiO_2$ layer 102 or using 2D material atomic layers in electronic and optical devices. In an embodiment, a variety of organosilanes SAMs 106, such as any compounds containing any of —OH, —SH, —$NH_2$, —$CF_2$, and —$CH_3$, may be used to create different interfaces which can cause to create modification of impurities trapped electronic/photonic properties and doping levels of the 2D atomic layered $SiO_2$ 102.

Because of such electronic/photonics changes, the embodiments herein can tailor device properties of the 2D atomic layered materials. The doping level may change due to charge trapping at the metal contact as well as the oxide interface when the device is exposed with the light in the visible range, and results in changes in the barrier height at the contact and amplifies the on-current. Thus, one can dynamically tune/control the photocurrent and photoresponsivity properties of 2D photo-detectors by selecting/switching with a specific desired SAMs even for only one given 2D material. These affects may be used to control and design approaches for tuning of electronic and photonic responsivity in the 2D materials. In an embodiment, similar strategies can be implemented to locally or globally dope device areas for memory applications. The control of photo-carrier traps may also have new applications in the field of quantum computing as controlling and modulation their properties allow for new computational means.

Figure 2:
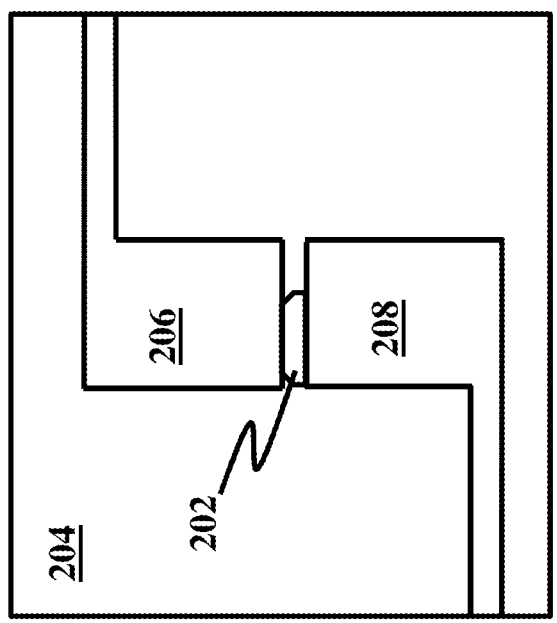
FIG. 2 is a schematic diagram illustrating a photo-detection device according to an embodiment herein.

FIG. 2, with reference to FIG. 1, is a schematic diagram illustrating a device 200, according to an embodiment herein. An embodiment herein uses the role of interfaces on the photo-detector properties of single-layered molybdenum disulfide ($MoS_2$) 202. An embodiment herein may control the interface properties of the substrate 204 by controlling the interfacial chemistry. Comparing the photo-detector properties of $MoS_2$ devices on a $SiO_2$ substrate versus a thiol-modified substrate, the embodiments herein demonstrate that interfaces have an important role in controlling the responsivity and response time of the 2D photo-detectors. Two connectors 206, 208 are electronically coupled together using the $MoS_2$ layer 202, and are used to measure photo detective properties of the $MoS_2$ layer 202.

FIG. 3A, with reference to FIGS. 1 and 2, is a schematic diagram of device 300 for electronic and optoelectronic characterization of a 2D photoelectric, according to an embodiment herein. The device 300 may include a substrate 302, and connectors 304, 306 on the substrate 302. The connectors 304, 306 may be electronically coupled to each other via photo-detector 308. In an embodiment herein, the photo-detector 308 comprises a $MoS_2$ layer. FIG. 3B, with reference to FIGS. 1 through 3A, is a schematic diagram illustrating an enlarged image of a channel 310 between the connectors 306 and 308, according to an embodiment herein. In an exemplary embodiment, the length of the channel 310 is between approximately 0.2 μm to approximately 3 μm. The measurements indicated on the figures herein are exemplary embodiments and are not limiting.

The measurement results described herein indicate that while the photosensitivity of the photo-detectors, such as the $MoS_2$ layer 202, can be enhanced through interface engineering, the device response time may be slightly compromised. This trade-off may be attributed to changes in the electrical contact barrier at the metal-semiconductor junction. Therefore, interface modification may result in deep interfacial traps at the vicinity of metal contacts, the photo-induced doping effects of which dramatically reduce the contact resistance and result in a major gain in photo-detection. However, the resultant dynamic of capture and emission rates may lead to low device response times. These results explain an important mechanism occurring in the contact regions of 2D photo-detectors and establish guidelines for the design of highly sensitive 2D optoelectronics.

The control of interfaces may be a strong tool for modifying the properties of device 300 based on 2D materials. One approach for modification of interfaces as provided by the embodiments herein is the application of SAMs. The diversity in the chemistry, MOSFET compatibility, and functionality of SAMs are characteristics that make them an attractive choice for such applications.

An embodiment herein uses thiol-based organosilanes as a diverse class of SAMs for modification of $SiO_2$ interfaces.

In an exemplary embodiment herein, thiol-terminated (3-Mercaptopropyl) methyldimethoxysilane ($CH_3Si(OCH_3)_{2(c)}H_{2(c)}H_{2(c)}H_2SH$) is used to modify the interface chemistry of $SiO_2$ substrates. In an example, to prepare the SAMs, an embodiment herein first treats the $SiO_2$ substrates with oxygen plasma for approximately five minutes to remove all organic residues and promote the formation of dense surface hydroxyl groups. Next, the embodiments herein place the substrates and a drop of organosilane precursor in a vacuum desiccator under moderate vacuum conditions (~5 mBar at approximately 60° C.) for roughly 2 hours. The prepared —$SH/SiO_2$ has a significantly larger contact angle (~65 degrees) as compared to pristine $SiO_2$ (~40 degrees), representative of the enhanced hydrophobicity of the SAM-modified surface.

FIG. 4A, with reference to FIGS. 1 through 3B, is a diagram illustrating x-ray photoelectron spectra (XPS) in photoelectron count per binding energy, acquired from the as-grown SAMs according to an embodiment herein. FIG. 4A illustrates a doublet peak, $S2p_{3/2}$ (sulfur 2p orbitals) 402 at 163 eV and $S2p_{1/2}$ 404 at 164 eV, an overall fit 406 obtained by adding the double peaks $S2p_{3/2}$ and $S2p_{1/2}$, and a spectrum 408 acquired by the measurements herein, associated with the unbound S2p sulfur bonds in the thiolate chemistry and further support the observation of interface modifications in the embodiments herein. The graph in FIG. 4A is obtained using the SAMs modified surfaces using XPS Al $K_\alpha$ x-ray radiation.

In an embodiment herein, $MoS_2$ samples are prepared using a chemical vapor deposition (CVD) technique and transferred to the —$SH/SiO_2$ substrates as well as to baseline, pristine 300 nm thick thermally oxidized P-type Si substrates. The transfer process may include coating the CVD-grown $MoS_2$ with Poly(methyl methacrylate) (PMMA) and releasing it from the substrate in a potassium hydroxide (KOH) solution. The PMMA/$MoS_2$ samples may be transferred to the desired substrates and the PMMA film removed using acetone solution. The SAMs modified interface may be referred to herein as $MoS_2$—$SH/SiO_2$ and may use the $MoS_2$—$SiO_2$ to describe a bare $SiO_2$ interface. The samples may then be characterized using Raman and photoluminescence (PL) spectroscopy.

Figure 4B:
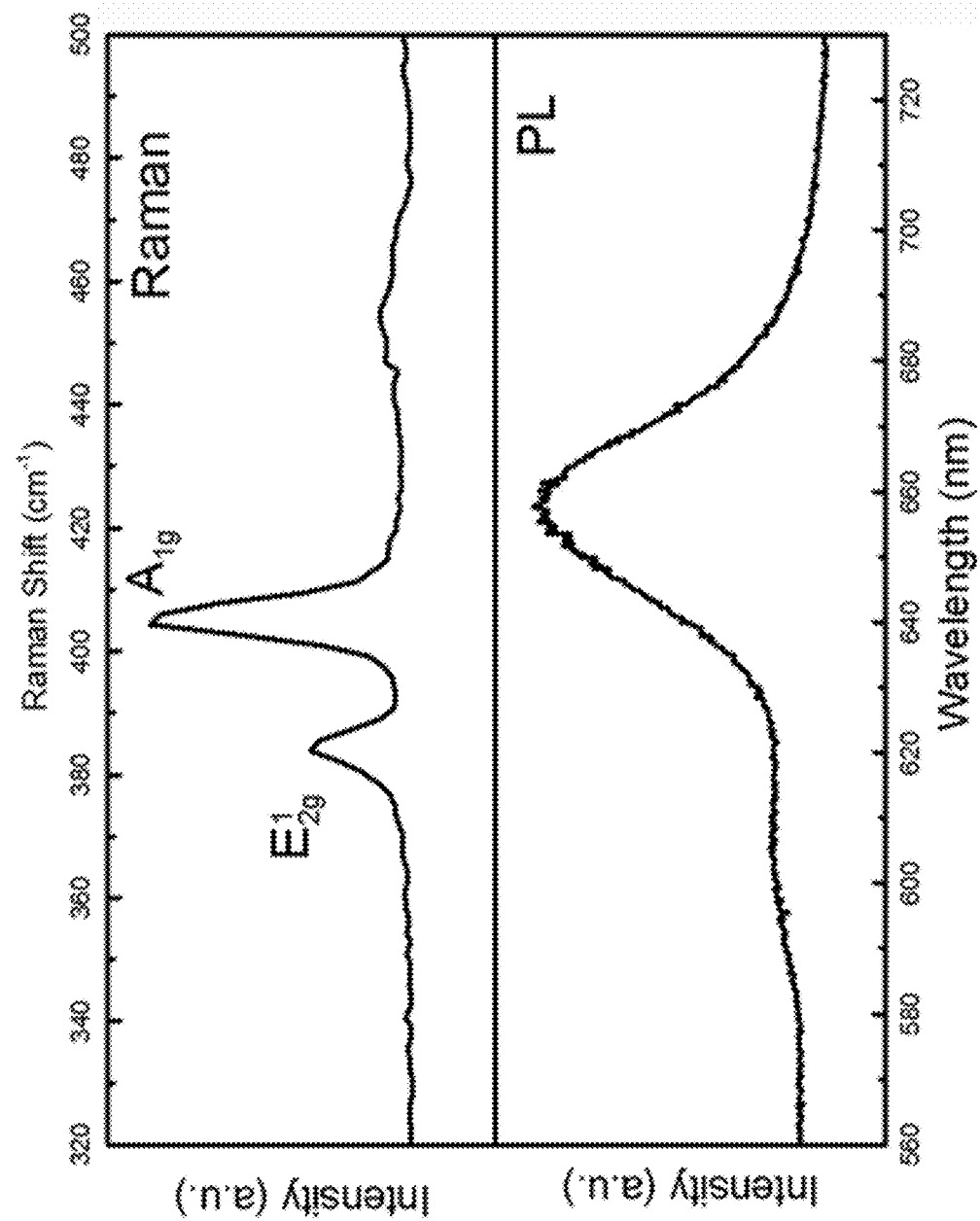
FIG. 4B is a graphical representation of a Raman and PL spectra acquired from a CVD $MoS_2$ on an $SiO_2$/Si substrate used in accordance with the embodiments herein.

FIG. 4B, with reference to FIGS. 1 through 4A, is a graph illustrating Raman and PL spectra acquired from CVD $MoS_2$ on $SiO_2$/Si substrates, according to the embodiments herein. The spacing between the $E^1_{2g}$ and $A_{1g}$ Raman peaks, ~20 $cm^{-1}$, and the intense PL spectrum are indicative of the high quality and monolayer nature of the $MoS_2$ samples. An embodiment herein uses e-beam lithography and oxygen plasma etch to pattern source/drain metal contacts and channel $MoS_2$ geometry to yield bottom-gated transistors on both the baseline and SAM-modified substrates. An embodiment herein use e-beam evaporation at ~5×$10^{-6}$ Torr to deposit 3 nm/50 nm thick Ti/Au metals as contact metal. Referred to FIGS. 3A and 3B, the device 300 may include single- and multi-channel length designs suitable for typical field-effect characterization, optoelectronic measurements, and contact resistance estimation using the transmission line method (TLM). The width of the device 300 may varies between 1-3 μm and the channel lengths vary between 0.2-3 μm.

To perform optoelectronic measurements on the $MoS_2$ sample, an embodiment herein uses a 532 nm laser with a beam diameter of 150 μm. The beam may be centered in such a way that the entire active device 300, including the 2D material, is in the incident light region. The laser power may be adjusted using an acoustic modulator and perform photocurrent measurements. First, the current-voltage characteristics may be measured for device 300 (40 μm wide with 3 μm channel lengths) in dark and illuminated conditions with an emphasis on understanding the influence of interface changes. An incident laser power of 3.4 μW may be used for these experiments.

Figure 5A:
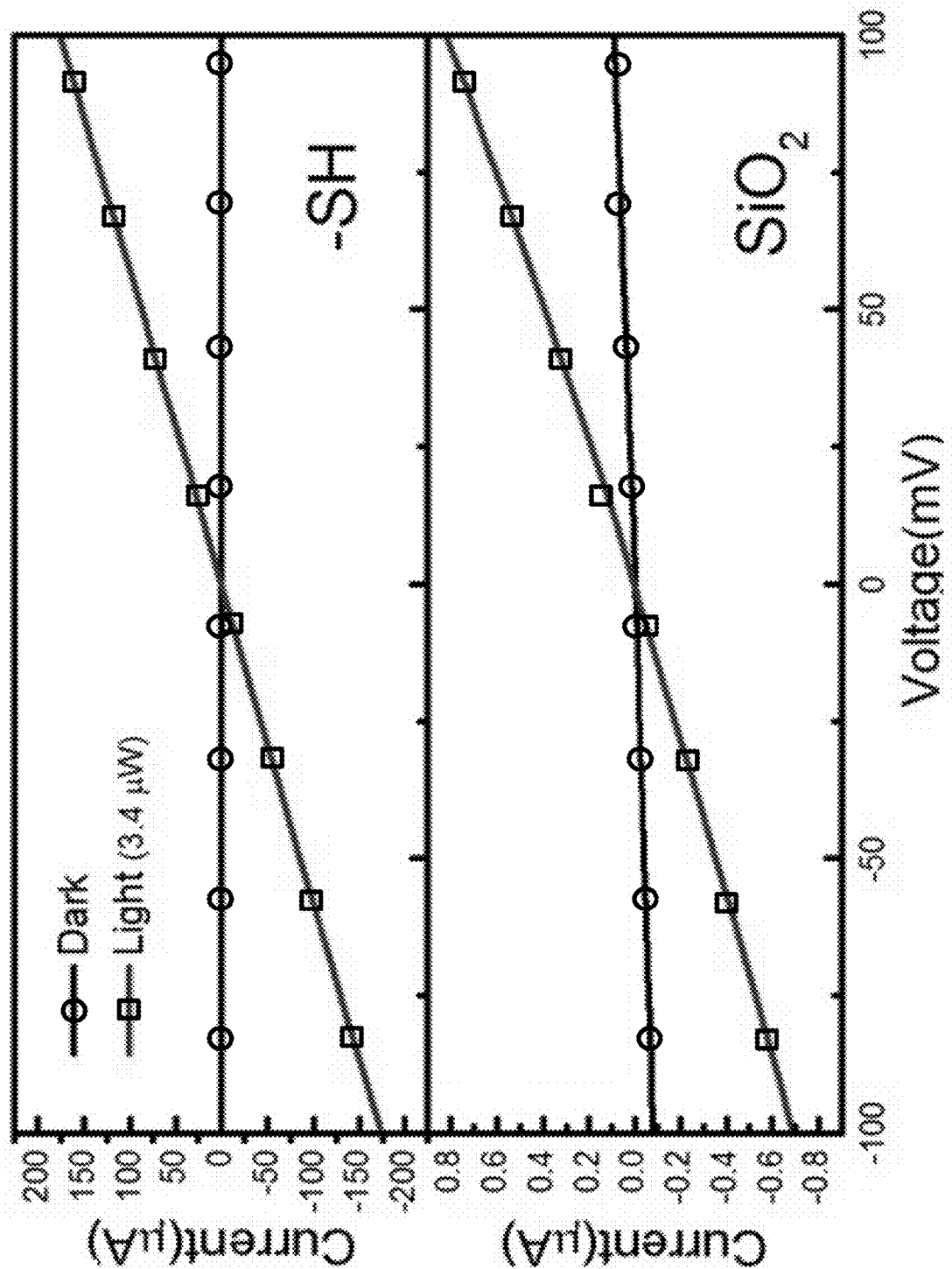
FIG. 5A is a graph illustrating numerical results of current-voltage experiments under dark and light conditions for devices with $MoS_2$—SH/$SiO_2$ and $MoS_2$—$SiO_2$ interfaces according to an embodiment herein.

FIG. 5A, with reference to FIGS. 1 through 4B, illustrates experimental results indicating a distinction between the behavior of devices made on $SiO_2$ and —$SH/SiO_2$. An increase in the conductance of the device 300, roughly by 4 orders of magnitude, is indicative of a high device response in $MoS_2$—$SH/SiO_2$ samples. These results, as compared to only one order of magnitude change in conductance for similar devices on $SiO_2$, exemplify a major difference in optical detection properties brought about by the SAM surface modification. In these experiments, the dark current in $MoS_2$—$SH/SiO_2$ devices measured at 0.1 V was close to one order of magnitude smaller than $MoS_2$—$SiO_2$ devices. Meanwhile, when illuminated, the current in $MoS_2$—$SH/SiO_2$ devices increased to roughly two orders of magnitude larger than that of $MoS_2$—$SiO_2$ devices. The lower dark current, as well as the large photocurrent generation in $MoS_2$—$SH/SiO_2$ devices, contributes significantly to the differences seen in the device 300 characteristics.

Figure 5B:
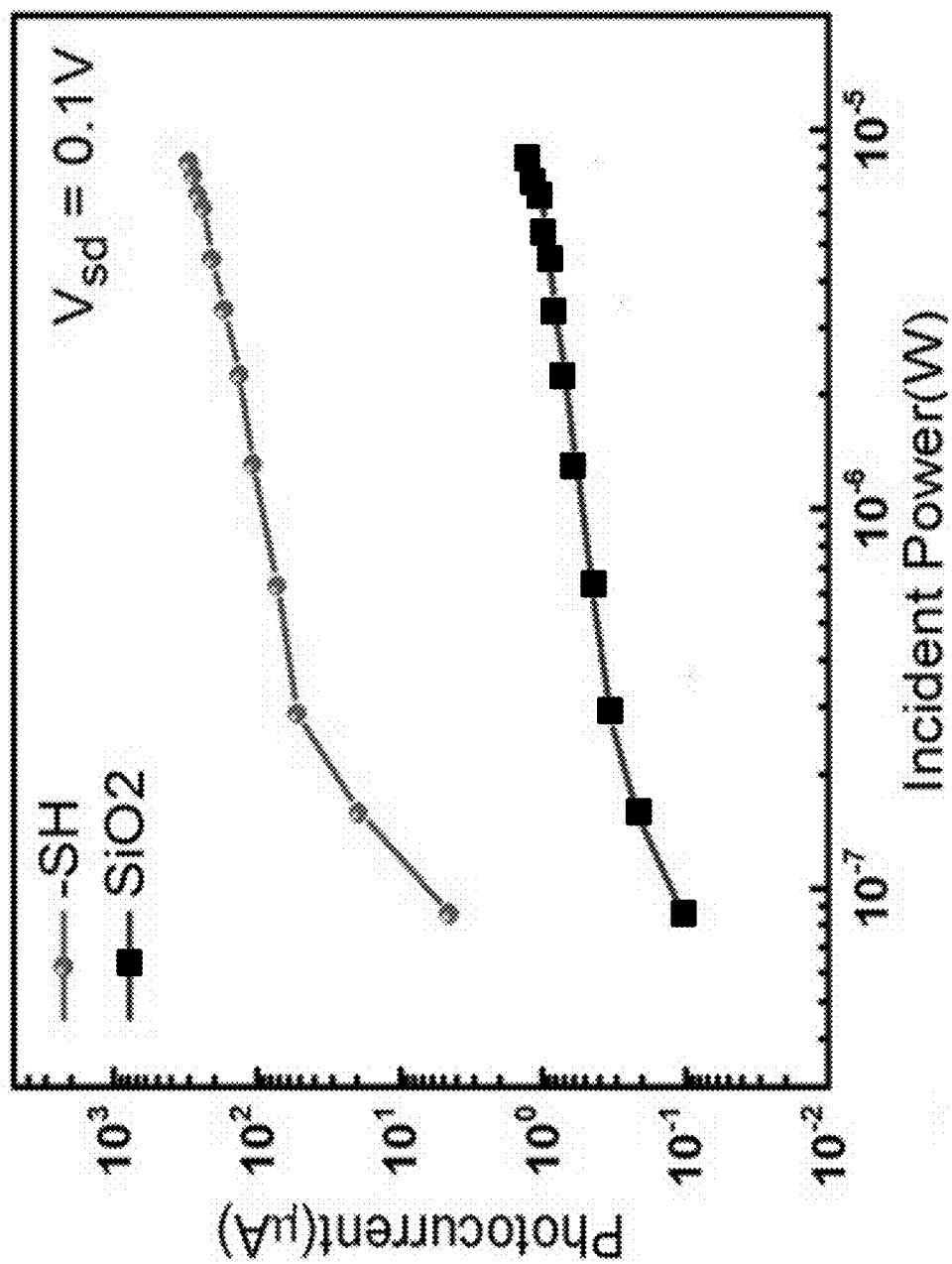
FIG. 5B illustrates a graphical representation of an incident power dependence of photocurrent according to an embodiment herein.

FIG. 5B, with reference to FIGS. 1 through 5A, illustrates results that further show the significant role of interface traps on the photo-detector characteristics of the device 300, and presents measurement of the photoresponse and light power dependency of the photocurrent. At lower power, the photocurrent rapidly increases in both $MoS_2$—$SiO_2$ and $MoS_2$—$SH/SiO_2$ interface conditions, with the changes leveling out at higher powers. The photocurrent is steadily close to two orders of magnitude larger in $MoS_2$—$SH/SiO_2$ interface conditions as compared to $MoS_2$—$SiO_2$. The device 300 responsivity for varied interfaces is calculated to further compare the performance from these two interface conditions.

The responsivity at wavelength (λ), $$R_\lambda = \frac{I_P}{P}$$

Figure 5C:
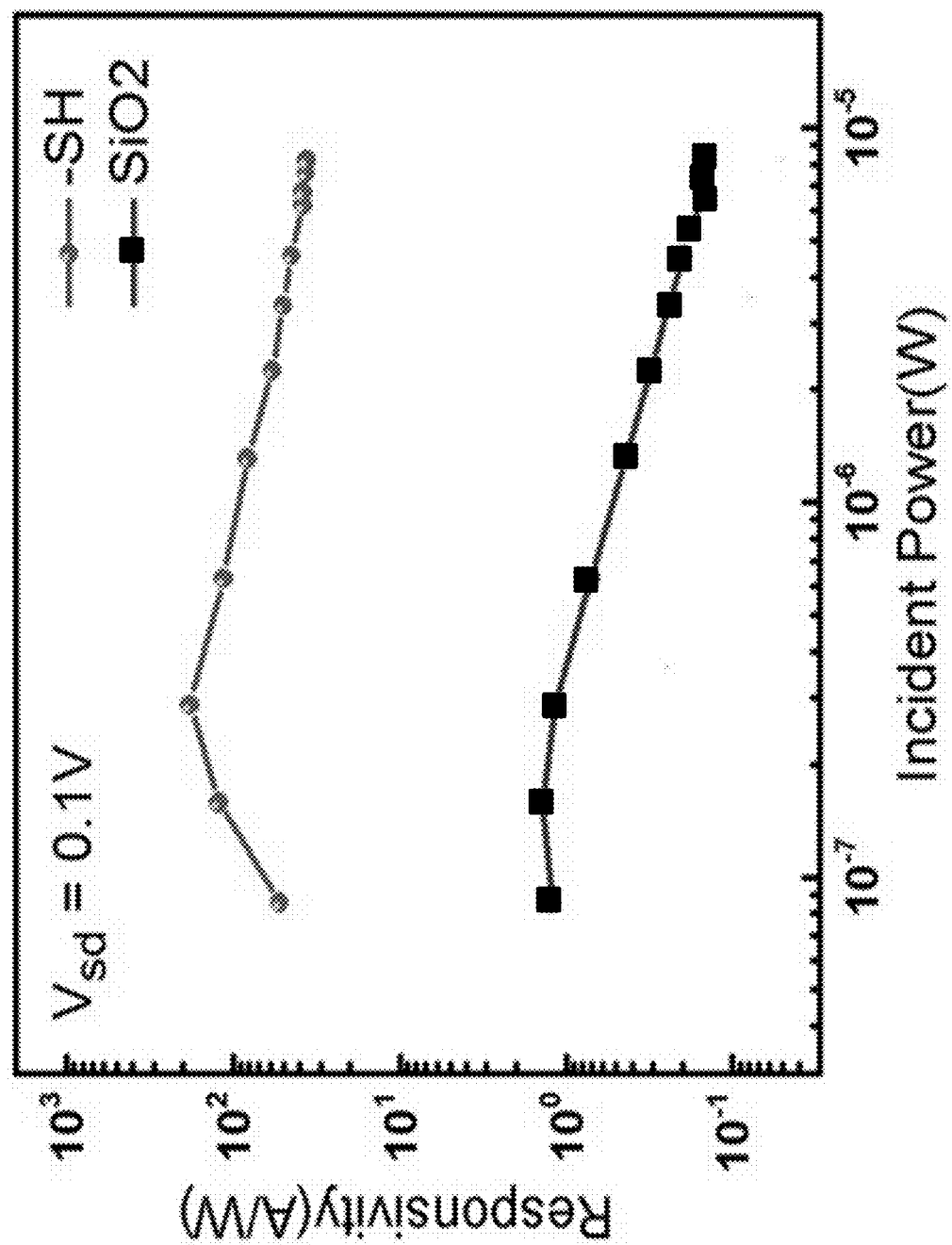
FIG. 5C illustrates a graphical representation of responsivity and its incident power dependence according to an embodiment herein.
Figure 5D:
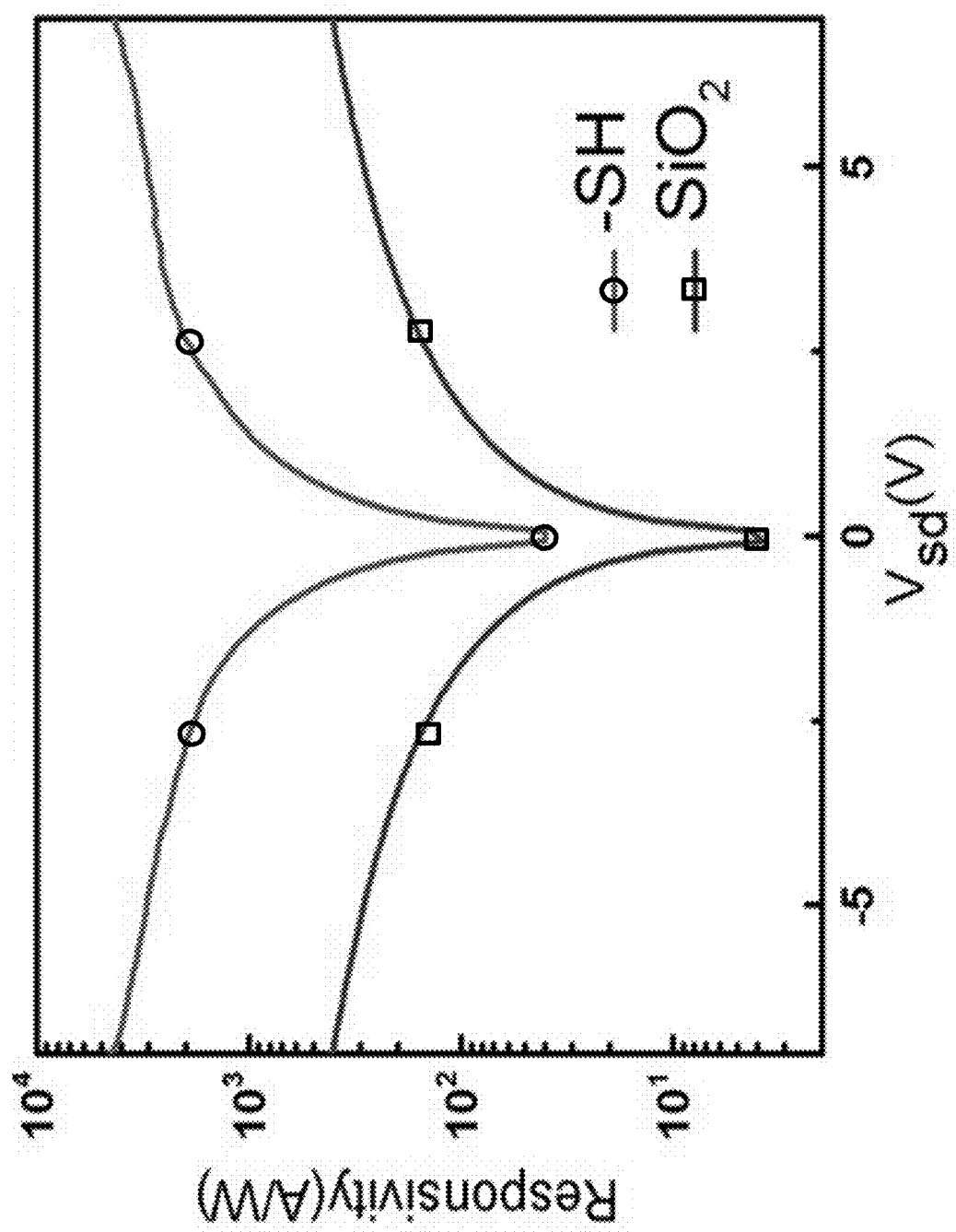
FIG. 5D illustrates a graphical representation of bias voltage dependency of responsivity in devices with both types of interfaces according to an embodiment herein.

($I_P$ being the photocurrent and P the incident light power) is a measure of the photo-detector's effectiveness in converting light power to electrical current. As illustrated in FIG. 5C, the responsivity in the device 300 sharply increases to a maximum and then gradually decreases as the incident power is increased. Owing to the direct proportionality to the photocurrent, the photoresponse in $MoS_2$—$SH/SiO_2$ devices also exhibits an increase of two orders of magnitude over that of $MoS_2$—$SiO_2$ devices. The photocurrent and, as a result, responsivity of the device 300 is also highly dependent on the applied bias voltage. The embodiments herein explain these effects by measuring the responsivity as a function $V_{ds}$ up to 7 V as illustrated in FIG. 5D. The measurements for $MoS_2$—$SH/SiO_2$ samples show high values for responsivity in $MoS_2$ devices, with at least one order of magnitude enhancement. External quantum efficiency is related to the responsivity of the device 300 through $$E.Q.E. = R_\lambda \frac{hc}{\lambda q},$$

where h is the plank constant, c is the speed of light, and q is the electron charge. The external quantum efficiencies in the device 300 reach maximum values close to 1000% and 10000%, for $MoS_2$—$SiO_2$ and $MoS_2$—$SH/SiO_2$ devices, respectively. Since the absorption in 2D materials is small, the extraordinary interface-dependent gain in device 300 that results in their large responsivities and quantum efficiencies needs to be explained.

Figure 6A:
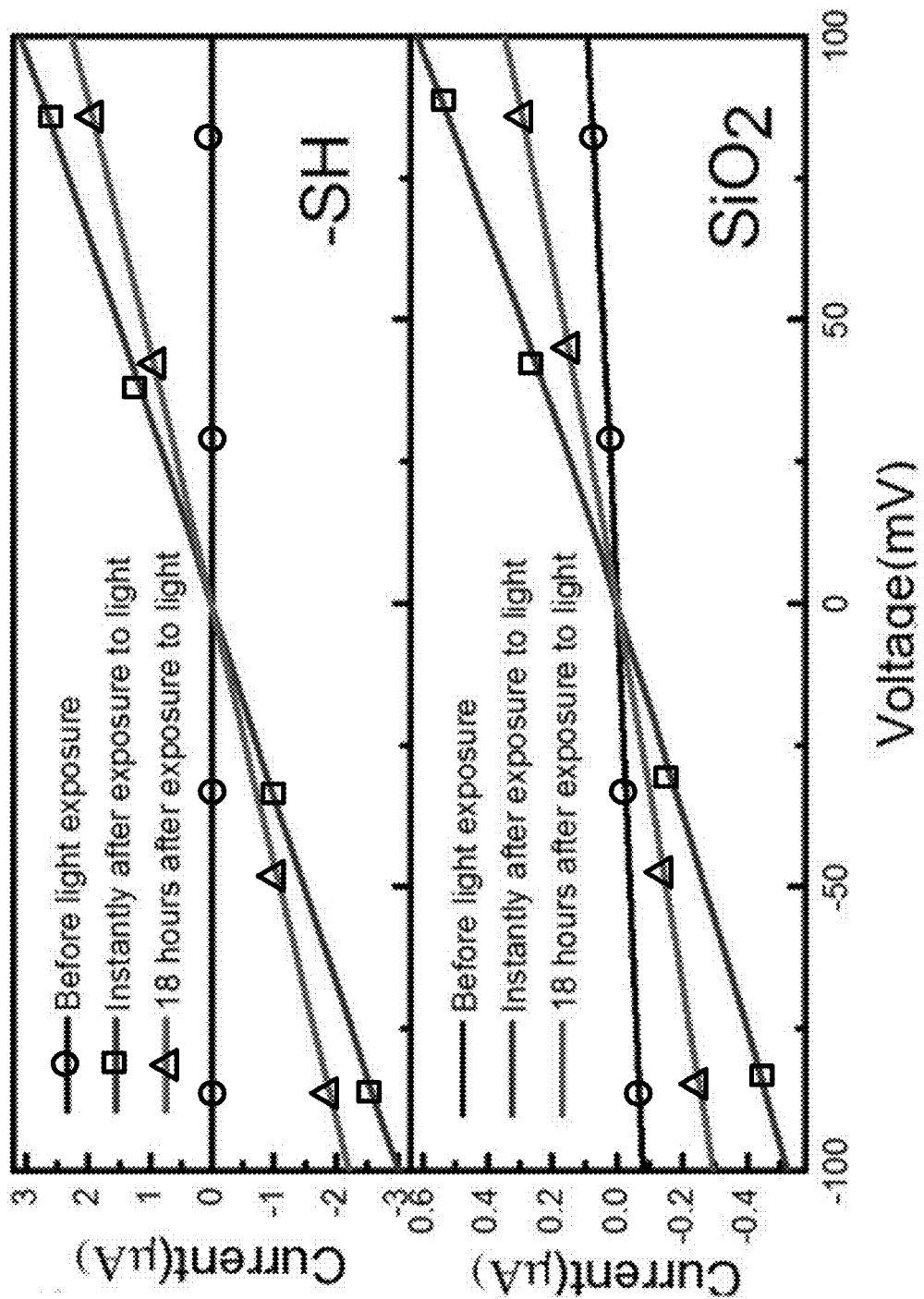
FIG. 6A illustrates the graphical results of current-voltage experiments before and after exposure to light in $MoS_2$—SH/$SiO_2$ and $MoS_2$—$SiO_2$ samples with time resolved photocurrents recorded at 3.4 µW light power, 2 Hz modulation frequency, and $V_{ds}$=1V according to an embodiment herein.

The embodiments herein further examine the temporal properties of the detector device 300 to improve understanding of the response time properties. A distinct feature of the current-voltage behavior in the device 300 is the consistent dependence on history of exposure to light; the device 300 with many hours of exposure to light shows higher conductance even if left in dark environments. The slow recovery of the device 300 conductance to values before exposure to light suggests that a slow dynamic process is involved. FIG. 6A, with reference to FIGS. 1 through 5D, is a graph illustrating measurement of the dark current-voltage characteristics of the device 300 before and after 30 min of exposure to 3.4 μW light. The conductivity increases by several orders of magnitude and remains high for a period greater than 18 hours. These effects are more prominent in the $MoS_2$—$SH/SiO_2$ samples. Time resolved photocurrent measurements are also performed to examine the photoresponse of the device 300 at a modulation frequency of 2 Hz.

Figure 6B:
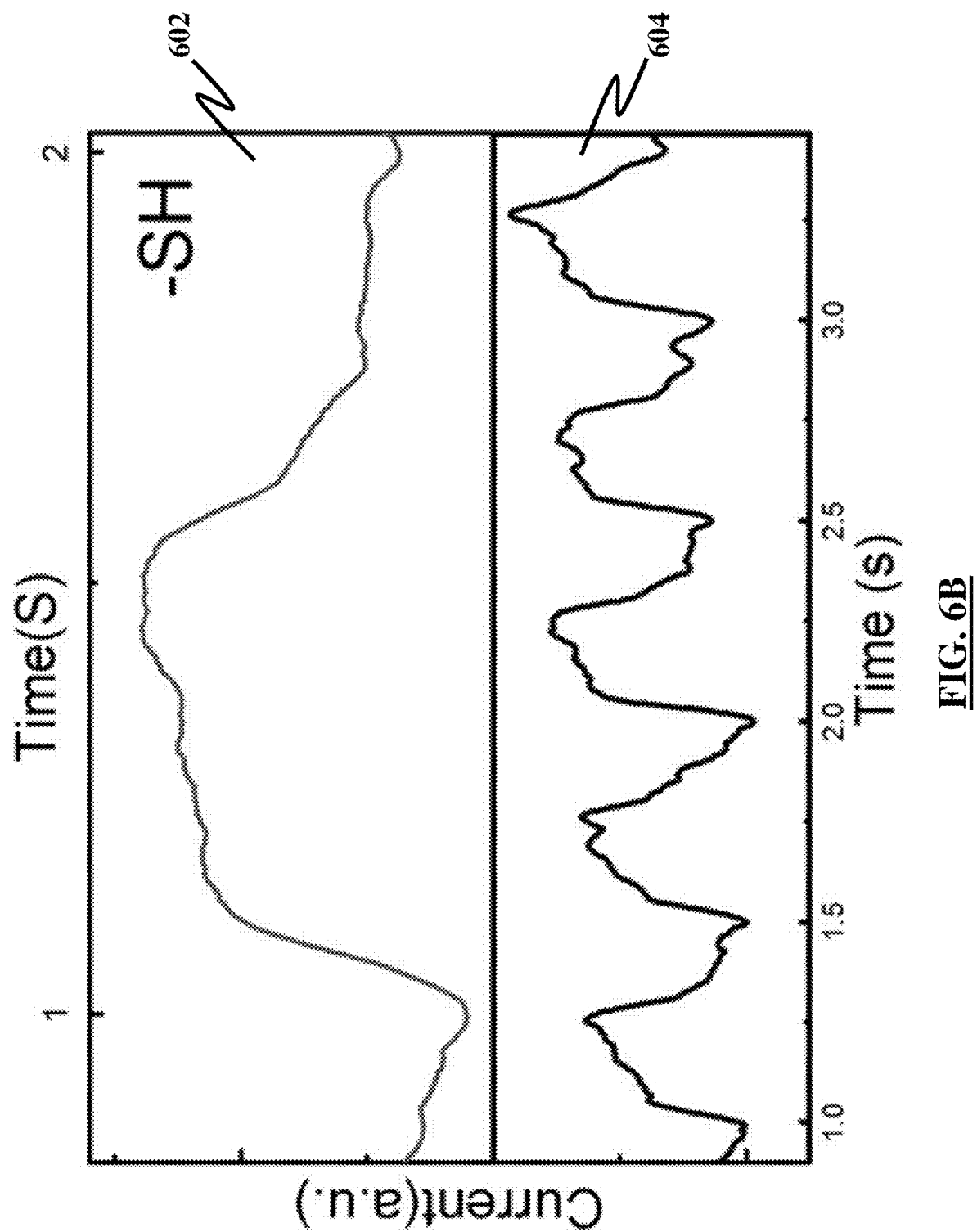
FIG. 6B is a graphical representation illustrating the time resolved photocurrents in a $MoS_2$—SH/$SiO_2$ sample according to an embodiment herein.
Figure 6C:
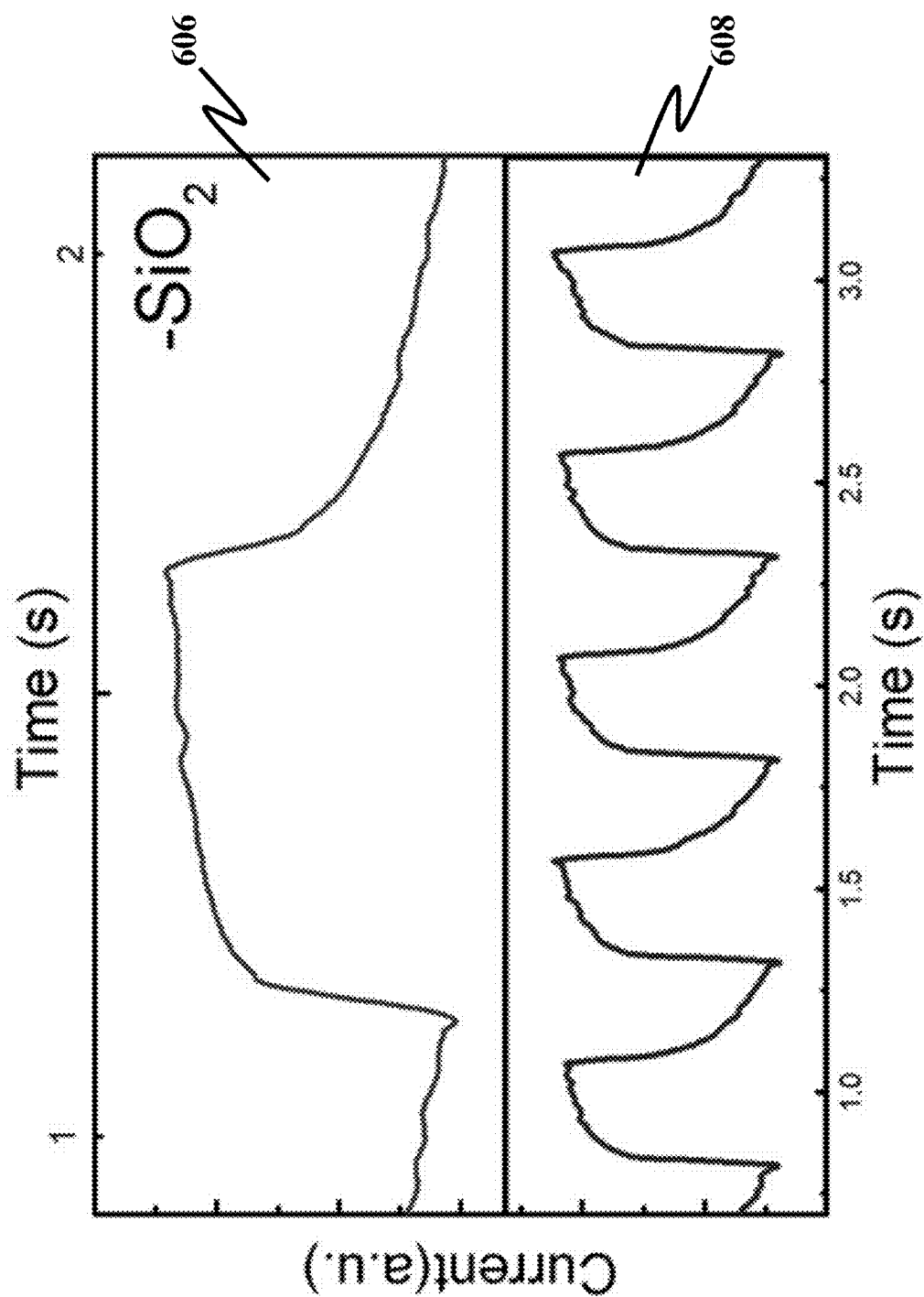
FIG. 6C is a graphical representation illustrating the time resolved photocurrents in a $MoS_2$—$SiO_2$ sample according to an embodiment herein.

FIGS. 6B and 6C, with reference to FIGS. 1 through 6A, illustrate five cycles of the measurements on lower panels 604 and 608, as well as a close-up of one representative cycle on upper panels 602 and 606, for further analysis. As is evident, there is a gradual increase in the average signal measurements in $MoS_2$—$SH/SiO_2$, and the measurements are slightly noisy. However, this gradual increase in current is not as dramatic in the $MoS_2$—$SiO_2$ devices. The distinct interface dependent behavior of rise and fall times in the device 300 signal resembles what was observed in FIG. 6A. The $MoS_2$—$SH/SiO_2$ devices show slower rise and fall times as compared to $MoS_2$—$SiO_2$ devices. Additionally, the long tail in both rise and fall characteristics suggest the involvement of two mechanisms of signal generation that needs to be determined. The net effect of these two mechanisms results in rise times of 140 ms and 96 ms for $MoS_2$—$SH/SiO_2$ and $MoS_2$—$SiO_2$, respectively. The fall times for these conditions amount to 186 ms and 151 ms for $MoS_2$—SH and $MoS_2$—$SiO_2$, respectively.

Figure 6D:
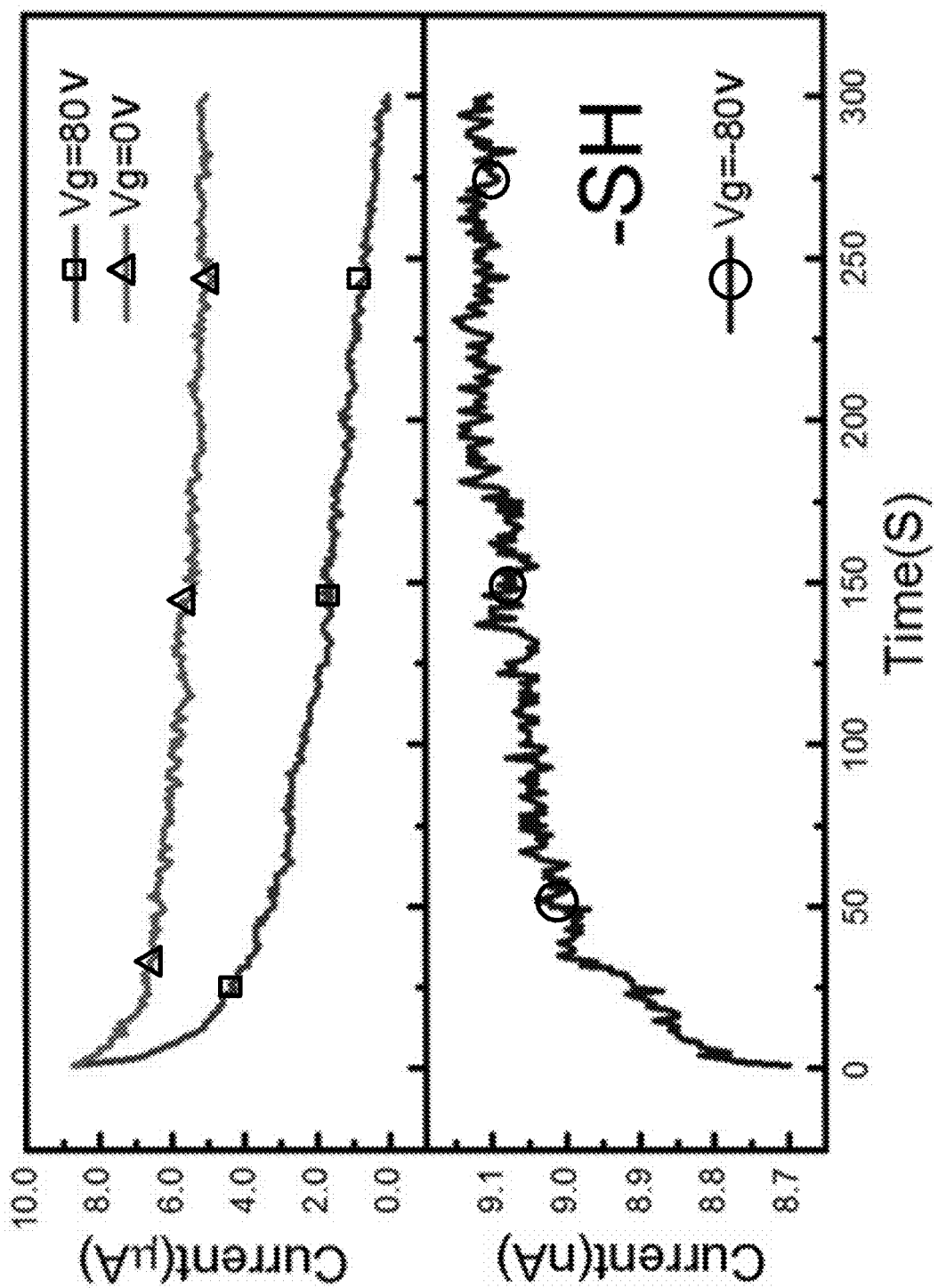
FIG. 6D is a graphical representation illustrating the changes in current for dark characteristics of $MoS_2$—SH/$SiO_2$ as a function of time and gate voltage according to an embodiment herein.

FIG. 6D, with reference to FIGS. 1 through 6C, is a diagram illustrating the dynamic behavior of the signal in a $MoS_2$—$SH/SiO_2$ sample by measuring the time dependency of current. After exposing the device 300 to 30 minutes of 3.4 μW light the current changes are measured over time at varied gate voltages in dark conditions, as presented in FIG. 6D.

FIG. 6D further illustrates that initially the signal drops quickly followed by a gradual and lengthy tail with zero and positive gate voltages. This behavior leads to a long recovery time of the device 300 to its original state as depicted in FIG. 6A. The measurements for the zero and positive 80V gate voltages are shown in the top panel of FIG. 6D. The measured current has been manually shifted, by subtracting a constant value from the positively gated signal, to match the starting currents in the two devices and allow for a better comparison between the different voltage conditions. As a result, the magnitude of the signal is arbitrary, but the changes represent the distinct time-dependent behavior of the current and its relation to gate voltage.

The faster decay of the signal in the positive vs. zero gate voltage conditions and the continuous increase in the signal under the negatively gated conditions (in this case −80V), presents a contrasting behavior. As the decay and recombination of excitonic pairs in a free excitonic system are in the picosecond time scales, a different mechanism with long life times should be responsible for the observed behavior. The trapping of the carriers at the interface and its resultant modification of the contact resistance in device 300 is a common observation in nanomaterial-based photo-detectors that leads to increased gain and photoresponsivity. Formation of such donor type interface electron traps at the junction and the vicinity of the metal-semiconductor-SAMs are postulated to be the primary source of interaction that govern the photo-detector properties in the device 300. Exposing the contact regions to light excites the trapped electrons in these sites and dopes the material, which amounts to significant changes in the contact barrier properties. To present this more clearly, some of the embodiments herein focus on the contact resistance properties of the device 300.

To understand these results and the origin of changes in the properties of device 300 some of the embodiments herein look at the general electronic transport and device properties of $MoS_2$ on $SiO_2$ and —$SH/SiO_2$ surfaces and assess some of the main distinctions resulting from the interface alterations. FIGS. 7A through 7D, with reference to FIGS. 1 through 6D, are graphs illustrating the transfer curves acquired for varied drain 804-source 802 (FIG. 8A) voltages for $MoS_2$—$SiO_2$ and $MoS_2$—$SH/SiO_2$, respectively. As illustrated in FIGS. 7A through 7D, a clear change in threshold voltage, subthreshold behavior, and hysteresis of the device 300 are observable. FIGS. 7A through 7D illustrate that the threshold voltages estimated from the transfer curves at $V_{ds}$=0.1V are −1V and 11V for $MoS_2$ on $SiO_2$ and on —$SH/SiO_2$, respectively. The subthreshold swings estimated for these devices also vary from 6V/decade in $MoS_2$—$SiO_2$ to 4V/decade in $MoS_2$—$SH/SiO_2$. The relatively high subthreshold swings are attributed to the limited gate control in these devices based on the 300 nm $SiO_2$ bottom gates. Even still, the lower subthreshold swing values in —$SH/SiO_2$ supported devices is indicative of the passivation role of the SAM for reducing interface trap charge states and the significant modification of band tails that extend into the $MoS_2$ band gap. The trap states at the substrate interface, resulting from point defects and 2D interfaces, can degrade both the mobility and switching characteristics of the device 300. The hysteresis may be significantly larger for the $MoS_2$—$SH/SiO_2$ samples, at 23.7 V compared to the $MoS_2$—$SiO_2$ with 2.5 V. A field-induced change in the interface states of the metal-semiconductor may be a reason for the observed hysteresis.

Figure 7A:
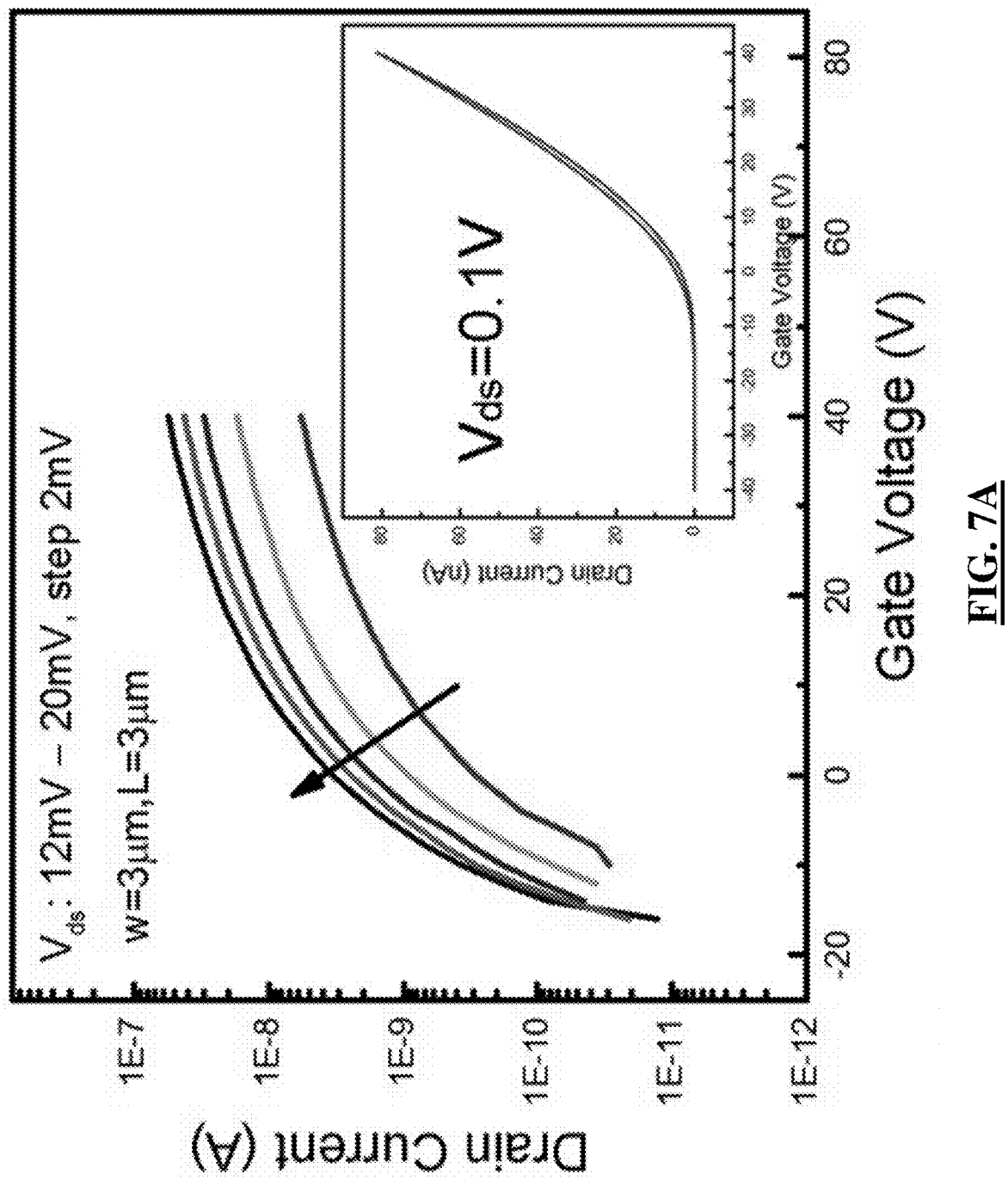
FIG. 7A is a graphical representation illustrating the logarithmic scale transfer curves for $MoS_2$—$SiO_2$ devices while $V_{ds}$ is changed between 12 mV and 20 mV, with the inset representing the linear scale transfer curve for these devices demonstrating the on-current and hysteresis according to an embodiment herein.
Figure 7B:
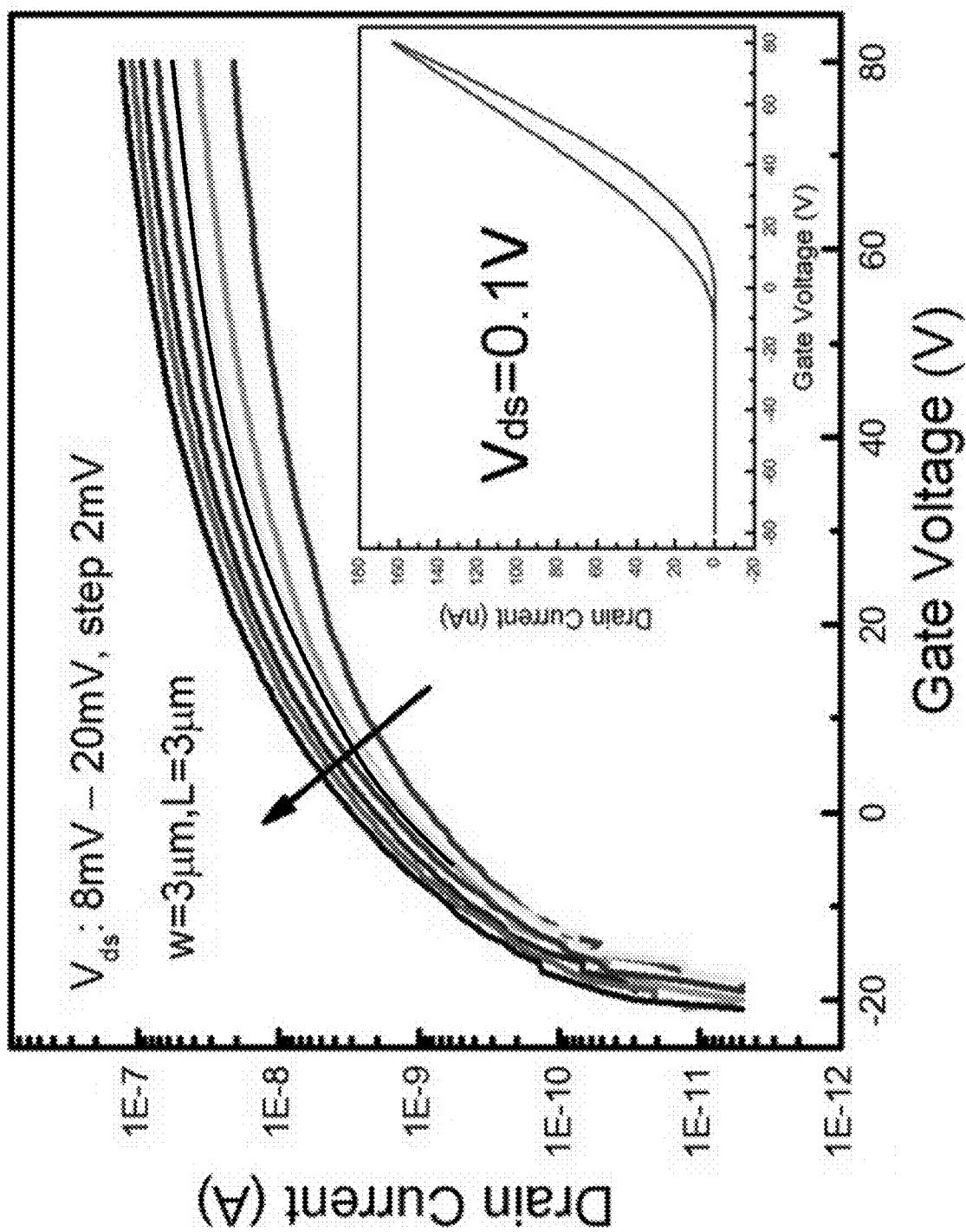
FIG. 7B is a graphical representation illustrating the logarithmic scale transfer curves for $MoS_2$—SH/$SiO_2$ devices while $V_{ds}$ is changed between 8 mV and 20 mV, with the inset representing the linear scale transfer curves for these devices demonstrating the on-current and hysteresis according to an embodiment herein.
Figure 7C:
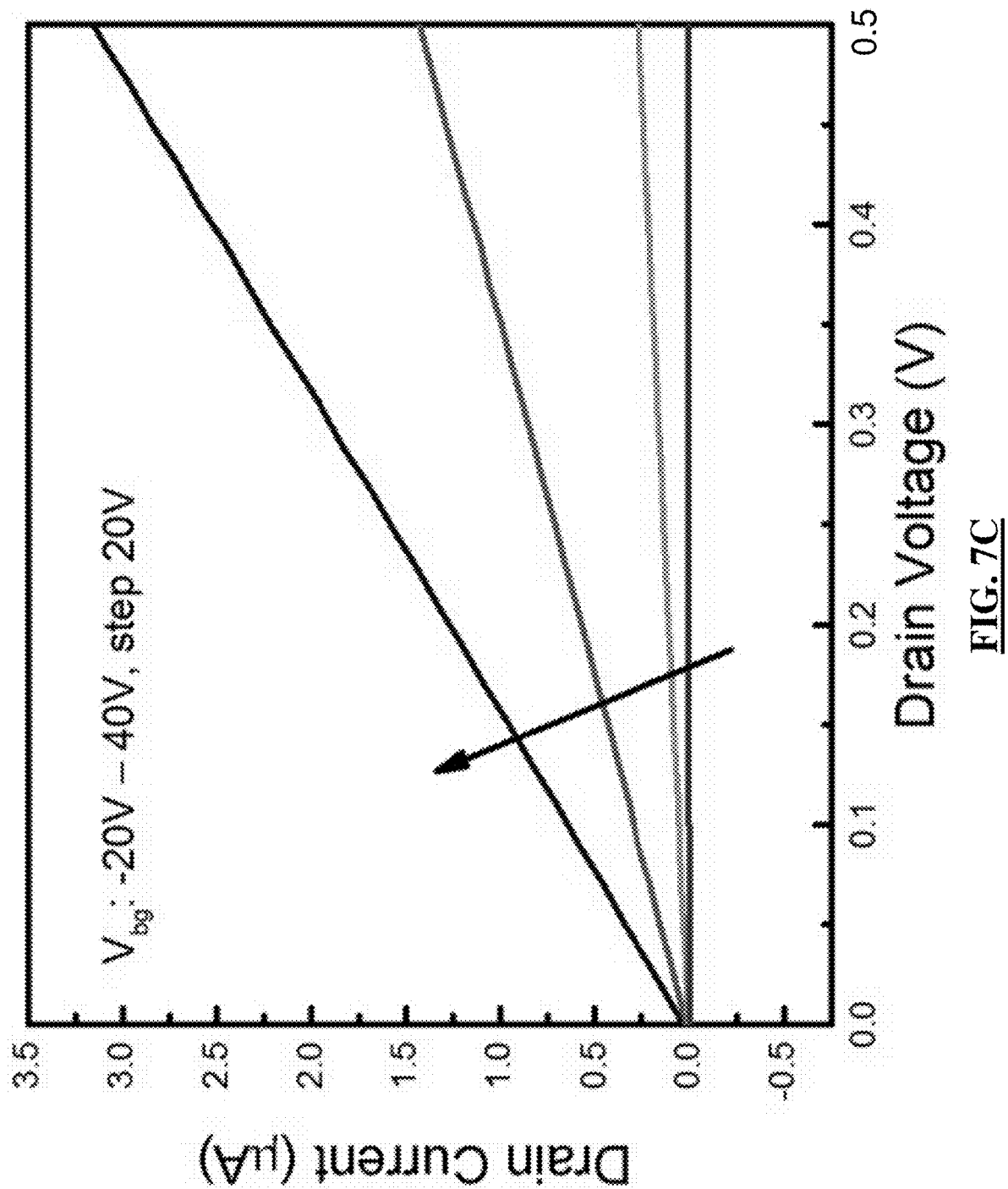
FIG. 7C is a graphical representation illustrating the output curves for $MoS_2$—$SiO_2$ devices while $V_{bg}$ is changed between −20V and 40V according to an embodiment herein.
Figure 7D:
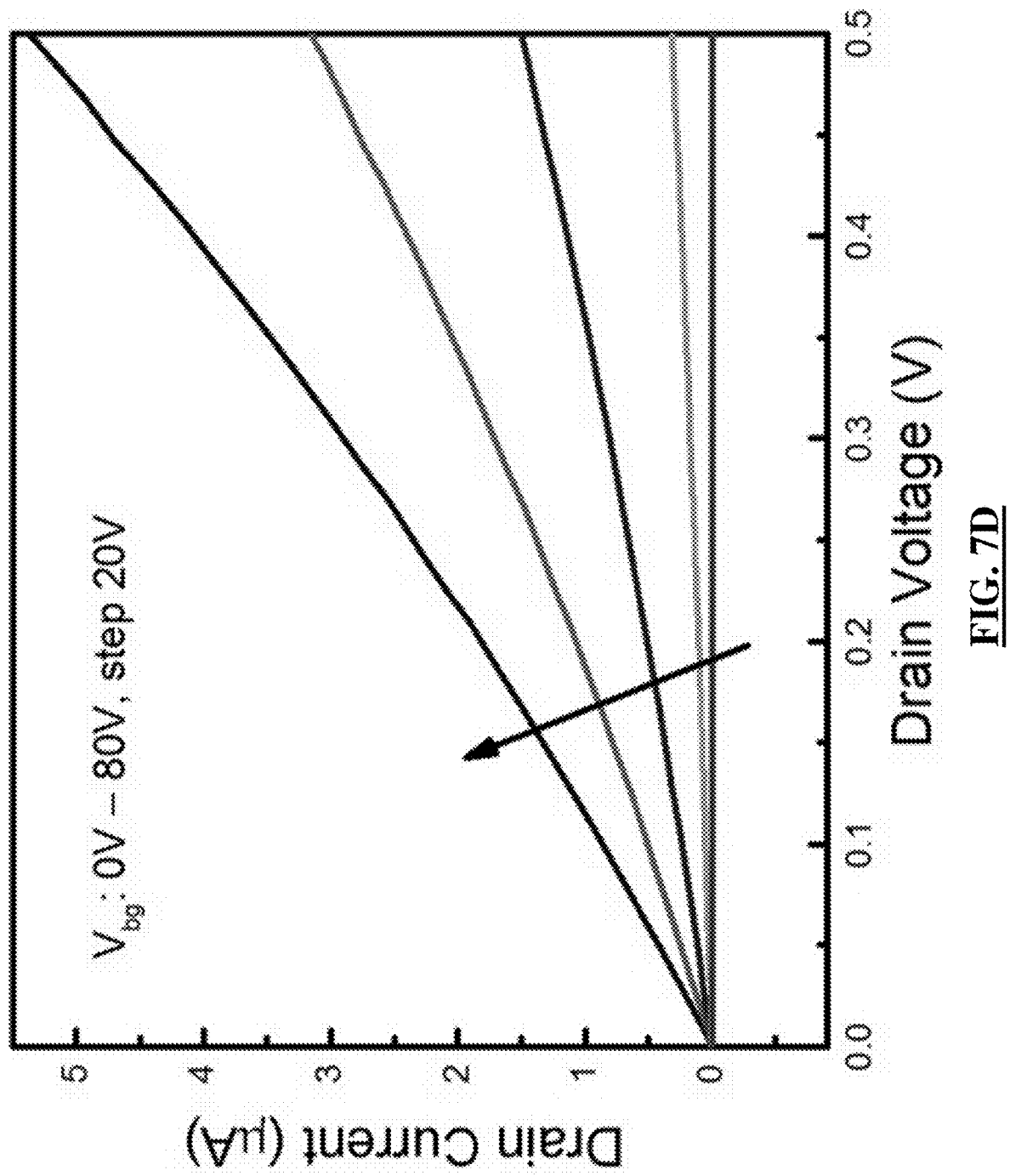
FIG. 7D is a graphical representation illustrating the output curves for $MoS_2$—SH/$SiO_2$ devices with $V_{bg}$ changed between 0V and 80V according to an embodiment herein.

The output curves shown in FIGS. 7C and 7D further distinguish the impact of the SAM-modified interface on $MoS_2$ device performance. The zero back gate voltage sheet resistances are roughly two orders of magnitude larger in $MoS_2$—$SH/SiO_2$ samples. The sheet resistance of a $MoS_2$—$SiO_2$ device is 2 MΩ/□ while the $MoS_2$—$SH/SiO_2$ sample has a sheet resistance of 371 MΩ/□. The slight nonlinearity in the IV characteristics of the $MoS_2$—$SH/SiO_2$ samples at low fields compared to $MoS_2$—$SiO_2$ samples suggests a difference in the electron transport at the metal-semiconductor junctions. From these experiments, an embodiment herein provides that the observed interface-dependent differences in the properties of device 300 are highly related to the role of contact barrier properties.

Figure 8A:
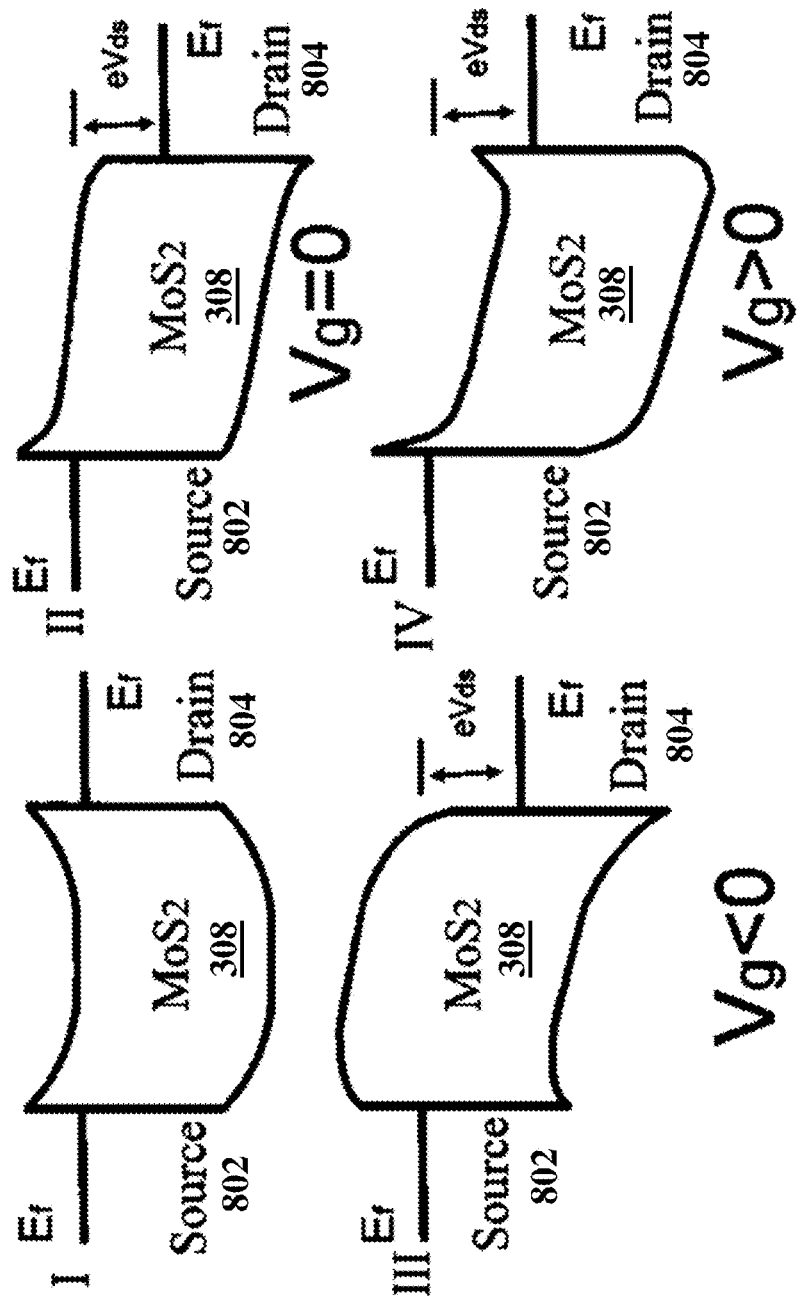
FIG. 8A illustrates a schematic diagram of the band diagram for $MoS_2$ and the formation and gate voltage dependence of contact barriers at the metal semiconductor junction according to an embodiment herein.

FIG. 8A, with reference to FIGS. 1 through 7D, is a schematic diagram illustrating energy band diagrams of the devices highlighting four relevant conditions at the metal-semiconductor contact. At the contact, the Fermi energy level of the metal (Au) is lower than the bottom of MoS$_2$ conduction band energy which results in bending of the bands and an electric field that depletes regions of the material of free electrons. This forms the contact barrier shown in Part I of FIG. 8A. If a bias is applied across the device 300, the electric field will slightly modify the barrier (Part II). By applying a gate voltage, the barrier width will change as shown in Parts III and IV. Therefore, to explain the role of traps on the contact resistance of device 300, the doping effects and the dynamic nature of trap capture and emission need to be considered. It is known that the doping of contact regions will result in contact resistance changes that follow the relationship (1):

$$R_c = \exp\left[\frac{2\sqrt{\varepsilon_s m^*}}{h}\left(\frac{\phi_{bn}}{\sqrt{N_D}}\right)\right] \quad (1)$$

where $N_D$ is the doping density, $\varepsilon_s$ is the relative semiconductor (MoS$_2$) permittivity, m* is the effective carrier mass, h is the Plank constant, and $\phi_{bn}$ is the barrier potential. In the photo-detector devices herein, emission of the deeply trapped electrons is promoted by the illuminated condition. This would result in a significant reduction of the contact resistance due to a trap induced increase in the doping density. The process of electron capture and emission after exposure to light and the transient doping of the contact barrier control the time dependent properties of device 300. Electrons are captured and emitted from the trap sites using a phonon assisted process and depend on the capture and emission activation energies. The capture and emission rates, $1/\tau_c$ and $1/\tau_e$, are related to several important trap, oxide gate, and semiconductor properties and can be expressed using the following relationship:

$$Ln\left(\frac{\tau_c}{\tau_e}\right) = \quad (2)$$
$$-\frac{1}{kT}\left[(E_{C_{OX}} - E_T) - (E_C - E_F) - \phi_0 + q\psi_s + q\frac{x_T}{T_{ox}}(V_{gs} - V_{FB} - \psi_s)\right]$$

where $\tau_c$ and $\tau_e$ are the capture and emissions times, $E_{C_{ox}}$ is the conduction band edge of the oxide (—SH/SiO$_2$), $E_T$ is the trap energy, $E_C$ is the conduction band edge of MoS$_2$, $E_F$ is the Fermi energy of the source 802 or the drain 804, $\phi_0$ is the difference between the electron affinities of MoS$_2$ and —SH/SiO$_2$, $\psi_s$ is the amount of band bending, $x_T$ is the position of the trap measured from the MoS$_2$—SH/SiO$_2$ interface, $T_{ox}$ is the oxide thickness, $V_{gs}$ is the gate source 802 voltage, and $V_{FB}$ is the flat band voltage.

Figure 8B:
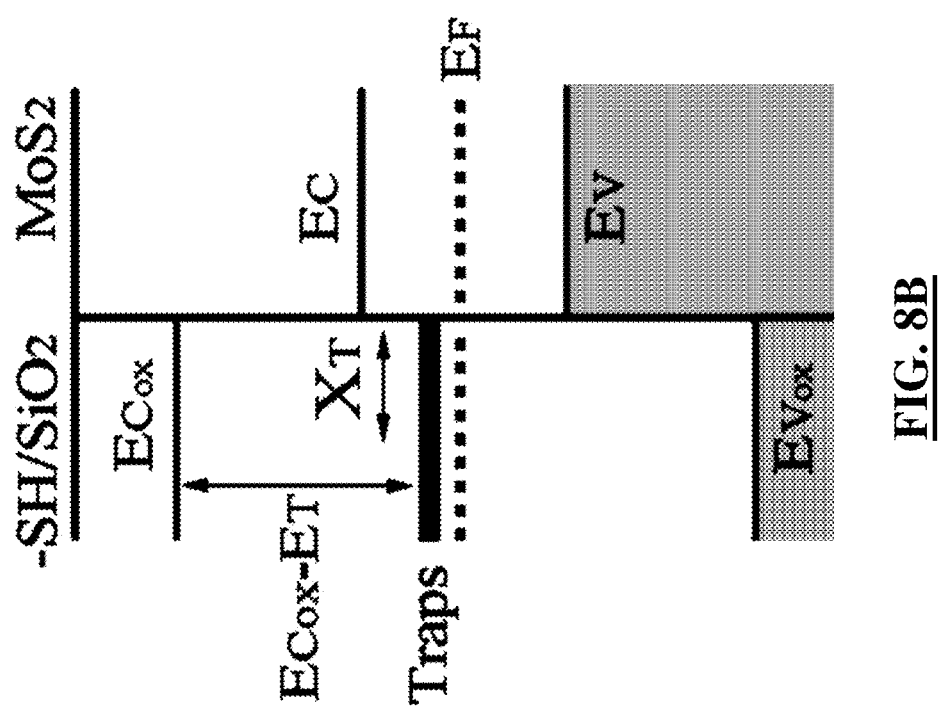
FIG. 8B illustrates an energy band diagram of $MoS_2$—SH/$SiO_2$ and the representation of deep trap states at the substrate interface according to an embodiment herein.

FIG. 8B, with reference to FIGS. 1 through 8A, is a schematic diagram illustrating an energy band diagram, according to an embodiment herein. This relationship describes the application of a positive or negative gate voltage that would have opposite effects on the trapping time properties and contact barrier. Here, $\tau_e$ is weakly dependent on the gate voltage. A positive gate voltage would therefore decrease the capture time while a negative gate voltage will increase it, having a direct effect on the dynamic nature of the contact resistance of device 300. In dark conditions, the traps will capture electrons and enforce a low doping level regime at the junction. Compared to the low trap density of MoS$_2$—SiO$_2$ devices, this will result in higher contact resistance and explains the lower conductance in MoS$_2$—SH/SiO$_2$ devices (FIG. 6A).

Exposing the samples to light excites the electrons into the conduction band and dopes the contact regions, thereby lowering the contact resistance. This explains the significant photocurrent generation in MoS$_2$—SH/SiO$_2$ devices (FIG. 6A). In transition between the dark and light conditions, the contact resistance and properties of device 300 are subject to the competing carrier capture and emission and the diffusion of the trap sites into and out of the contact barrier regions. In zero gate voltage conditions, exposure to light will gradually excite the traps. The planar electric fields will also gradually diffuse more traps into the contact barrier region. In dark conditions, the traps will slowly capture the free carriers and result in a gradual increase in the contact resistance (FIG. 7D top panel). If a positive gate voltage is applied, the trapping capture times, $\tau_c$, will decrease and the electron capture rates will increase.

The net effect will result in a rapid increase in the contact resistance and a drop in the signal of device 300 (FIG. 7D top panel). With an applied negative gate voltage, the $\tau_c$ increases and the capture rate decreases. These effects, in addition to the field induced diffusion of traps, contribute to the contact barrier changes. Migration of defects in 2D materials may be use to explain memristor device characteristics in MoS$_2$ devices with varied concentrations of sulfur vacancies. These results suggest that point defects can migrate in these materials from high density defect regions, such as grain boundaries, in sufficiently large enough electric fields (~1 MV/m).

The field assisted diffusion of the traps into the contact regions contribute to the initial contact resistance decrease in device 300. Over time the diffusion of traps into the contact regions is balanced by a decrease in the electron capture and the contact resistance and current reach an equilibrium state in device 300 (FIG. 7D bottom panel).

Figure 8C:
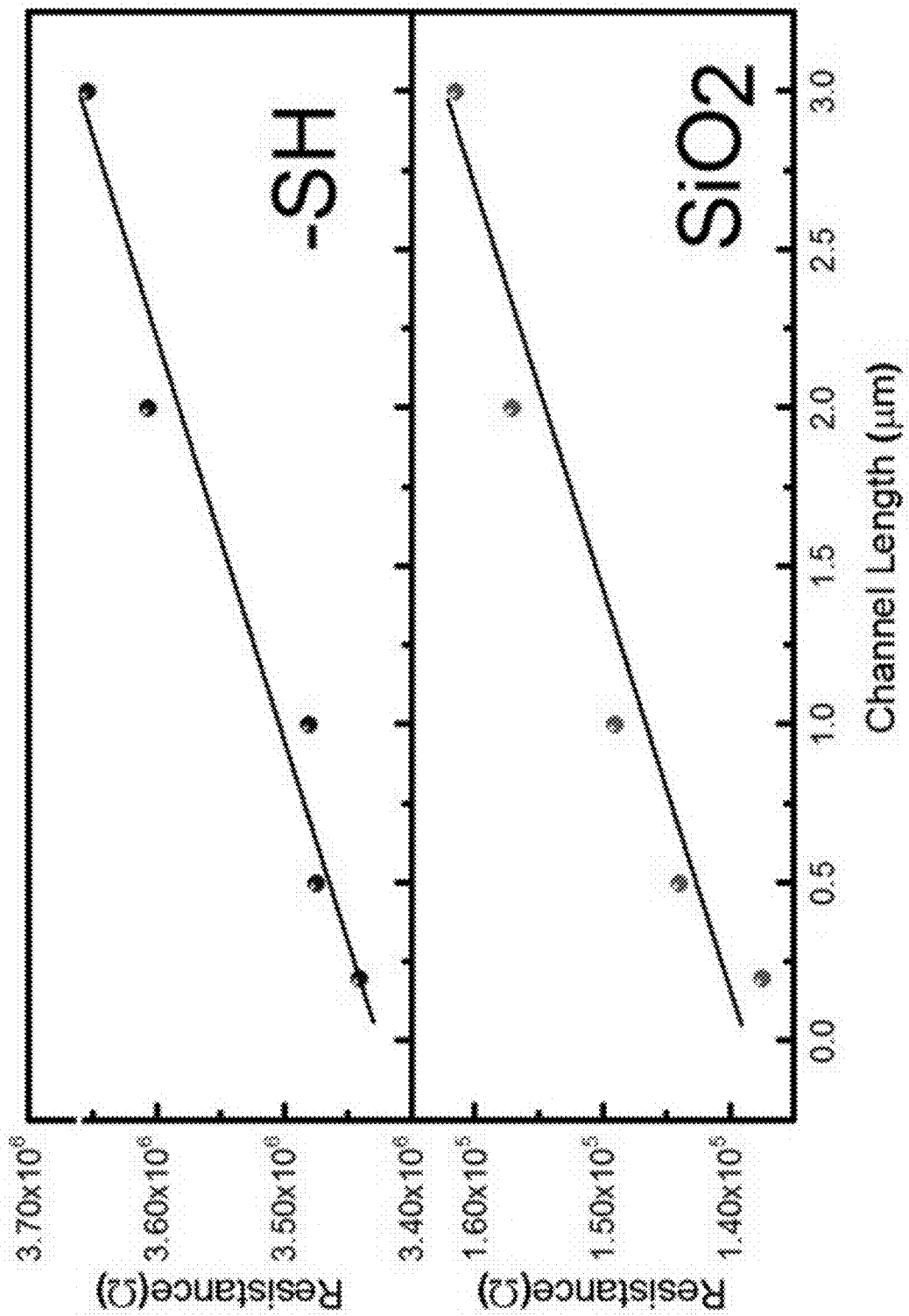
FIG. 8C illustrates transfer length measurements for $MoS_2$ samples on varied interfaces before light exposure according to an embodiment herein.
Figure 8D:
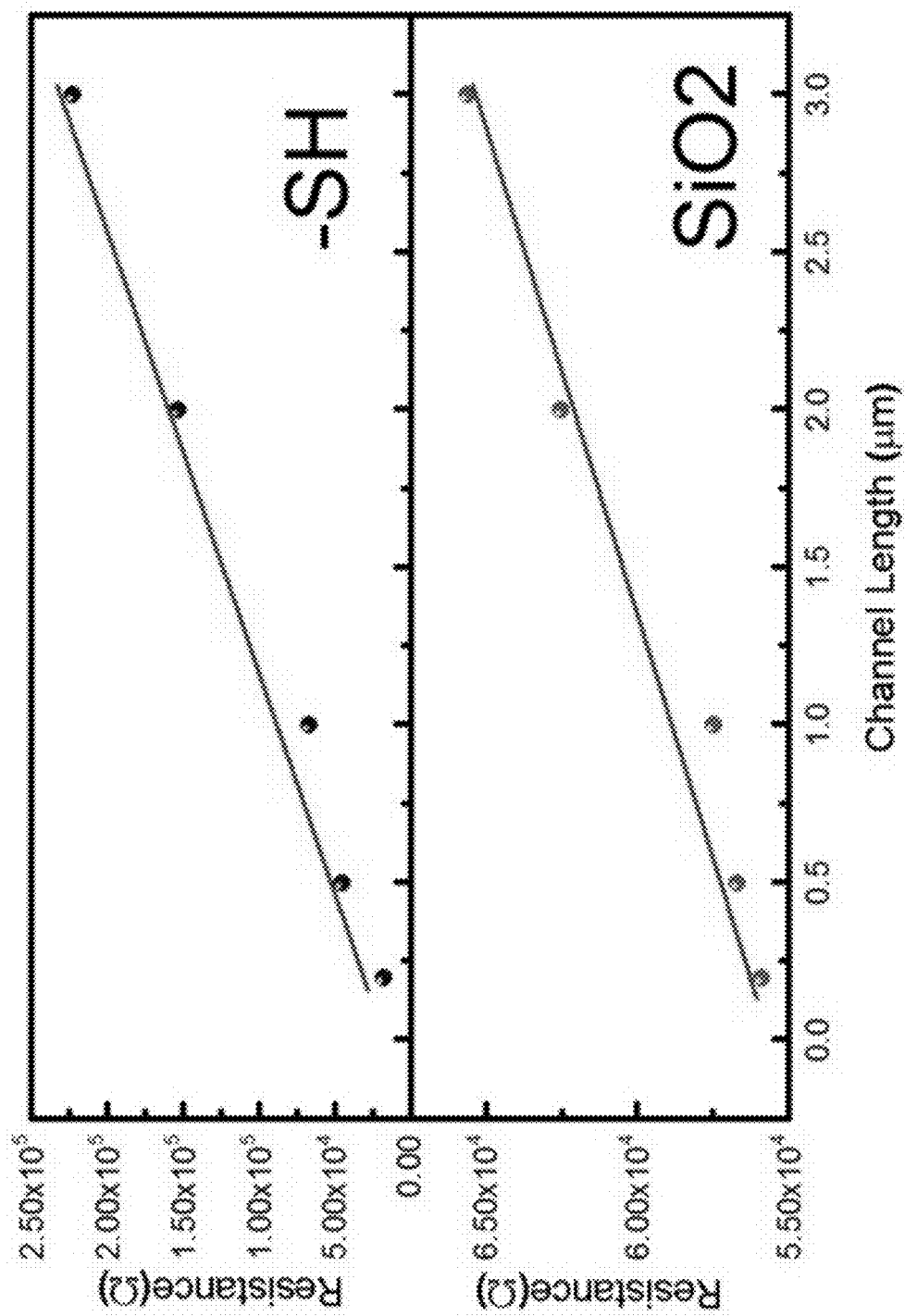
FIG. 8D illustrates transfer length measurements for $MoS_2$ samples on varied interfaces after light exposure according to an embodiment herein.

FIGS. 8C through 8D, with reference to FIGS. 1 through 8B, are diagrams confirming the above-described propositions and comprehend the role of metal-semiconductor-oxide interfaces in the device 300 according to the embodiments herein, and assess the contact resistances in the device 300 using Transfer Length Measurements (TLM). According to these measurements, the contact resistance before light exposure for MoS$_2$—SH/SiO$_2$ and MoS$_2$—SiO$_2$ is 3400 kΩ·μm and 140 kΩ·μm, respectively. Immediately after exposure to light, the contact resistances measured for the same devices changes to 3 kΩ·μm and 25 kΩ·μm for MoS$_2$—SH/SiO$_2$ and MoS$_2$—SiO$_2$ devices, respectively (FIG. 8D).

This indicates that the contact resistance for both interface conditions is dependent on the exposure to light. This is especially true for the MoS$_2$—SH/SiO$_2$ devices where the contact resistance is found to decrease by three orders of magnitude, which would explain the significant increase in photosensitivity of the devices. The sheet resistances of the channel material (slope of the TLM fit) in devices made on different interfaces before and after light exposure can be compared.

The sheet resistances for MoS$_2$—SH/SiO$_2$ and MoS$_2$—SiO$_2$ devices before exposure to light are 80KΩ/□ and 8KΩ/□, respectively. After exposure to light, the sheet resistance decrease slightly to 73KΩ/□ and 6KΩ/□ for MoS$_2$—SH/SiO$_2$ and MoS$_2$—SiO$_2$ samples, respectively. The difference between the sheet resistances for each interface can be attributed, in addition to expected sample to sample changes, to the doping levels resulting from charge transfer from the 2D material to the SAMs. The small changes to the sheet resistance of the device 300 before and after exposure to light are an additional confirmation of the importance of contact resistance to the behavior of device 300. The results described herein directly link the photocurrent characteristics of $MoS_2$—SH/$SiO_2$ devices to their dynamic contact resistance properties.

It is evident that the greater part of the gain in the photocurrent of the devices is a result of the higher contact resistance change in $MoS_2$—SH/$SiO_2$ devices. The low dark currents in $MoS_2$—SH/$SiO_2$ devices combined with significantly higher photocurrent due to doping induced changes in the device contact resistance results in the significant photoresponse in these devices.

The mechanisms provided by the embodiments herein also explain the behavior of responsivity as the incident power increases. The general behavior of the photo-detector is markedly influenced by the magnitude of the interface trap population near the contact regions. The population of excited trap states is closely related to the trapping and de-trapping time constants as well as the incident light intensity. As the intensity of light increases, the population of excited traps increases. The excited trap population reaches equilibrium at higher intensities where most traps have been excited. This results in a gradual decrease in the responsivity of the photo-detectors as the contact resistance changes slow down because of the saturation in the doping level.

Figure 9:
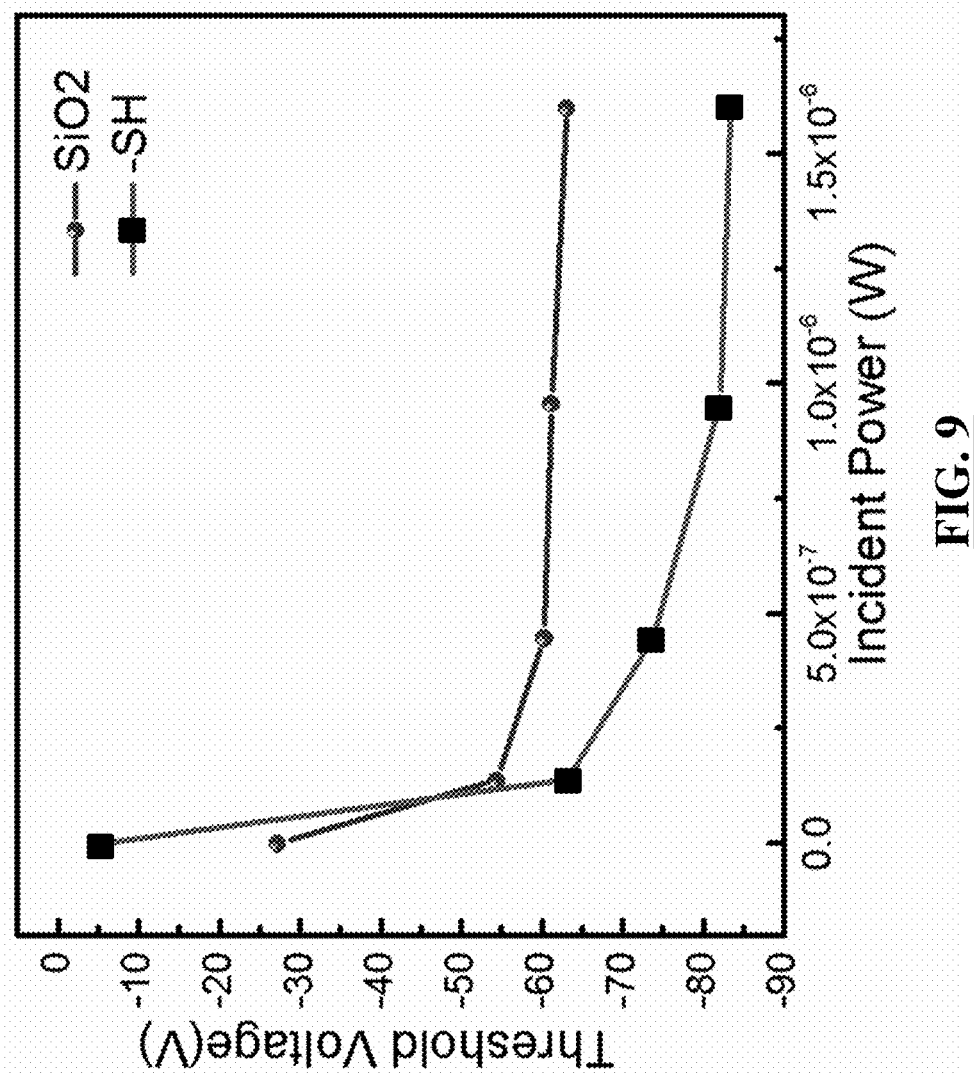
FIG. 9 is a graphical representation illustrating changes in the threshold voltage acquired from the transfer curves from devices made on $MoS_2$—$SiO_2$ and $MoS_2$—SH/$SiO_2$ interfaces according to an embodiment herein.

FIG. 9, with reference to FIGS. 1 through 8D, is a diagram used to examine the trap characteristics by measuring the transfer curve threshold voltages, acquired from the device 300 after every measurement at different incident power, according to an embodiment herein. The magnitude of threshold voltage changes is significantly larger in the $MoS_2$—SH/$SiO_2$ as compared to $MoS_2$—$SiO_2$ devices. The changes in the threshold voltage of the device 300 relative to the dark current devices may be attributed to doping. Since the sheet resistance of the channel material does not change much after exposure to light, the threshold voltage changes can be attributed to the increase in contact region doping. The magnitude of doping can be estimated by measuring the changes in the threshold voltage ($n_T = \varepsilon_o \varepsilon \Delta V_T /$te, where $\varepsilon_o$ and $\varepsilon$ are the permittivities of free space and $SiO_2$, respectively; e is the electron charge; t is the thickness $SiO_2$ layer (285 nm); and $\Delta V_T$ is the threshold voltage change). The $\Delta V_T$ estimated in the dark and light condition at incident powers close to saturation of threshold voltages, can be used to roughly estimate the trap population. The estimated number of traps in $MoS_2$—SH/$SiO_2$ and $MoS_2$—$SiO_2$ interfaces is $6.1 \times 10^{16}$ and $2.8 \times 10^{16}$, respectively. It may be concluded that the higher number of traps in $MoS_2$—SH/$SiO_2$, by roughly a factor of two, enables the markedly high responsivity in the photo-detectors made on this interface.

Self-assembled monolayers are a powerful tool for controlling oxide interfaces and can be used to modify the interface properties of 2D $MoS_2$ devices. The influence of interface interactions is found to be related to the defect energy states they generate in the bandgap of a 2D material. The shallow and deep states lead to trapping of the free carriers and affect a variety of device properties. The results described herein demonstrate that substrate interface properties have a direct role in the photo-detector properties of 2D $MoS_2$ devices. The embodiments herein show that the excitation and trapping of carriers at the interface in the affinity of the metal-semiconductor contact regions can dope and modify its barrier properties. These effects slowly change the contact resistance of the device 300 after exposure to light. The net effect of the interactions results in extremely high device responsivities but also somewhat compromises their response speeds. Therefore, the control of trap properties at the interfaces of 2D materials is a highly effective design strategy and a substantial tool for control of their device properties.

In the embodiments herein, the photo-detection characterization is performed using a controlled environment probe station with a 1-inch fused silica optical window for sample illumination and a vacuum capability of $10^{-6}$ Torr. A 543 nm wavelength He/Ne laser can be used as the light source. An acoustic optical modulator (AOM) can be used for laser intensity stabilization, control, and modulation (for light pulse generation). The turn-on and turn-off time constants of the couple laser-AOM are measured to be less than 150 ns. After passing through the AOM, a laser is directed to the optical window and focused onto the sample placed inside the vacuum probe station. In an embodiment herein, the device 300 is powered with a Keithley 2634B dual-channel source meter unit connected to the probe station with a triaxial cable for low-noise measurement. The read-out currents are amplified by a Stanford Research Systems (SR570) low-noise current amplifier and recorded by a 10 MHz bandwidth Teletronix oscilloscope.

Figure 10:
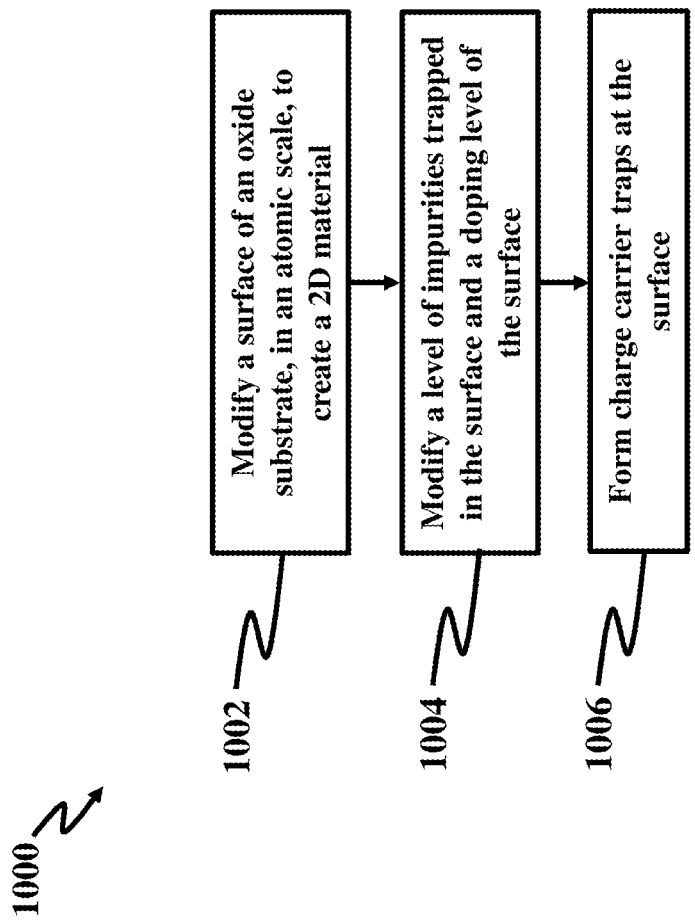
FIG. 10 is a flow diagram illustrating a method according to an embodiment herein.

FIG. 10, with reference to FIGS. 1 through 9, illustrates a flow diagram illustrating a method 1000 for controlling any of a responsivity, response time, and trap characteristics of a 2D material on a SAMs device 300 according to an embodiment herein. The method 1000 may include modifying (1002) a surface of an oxide substrate, in an atomic scale, to create the 2D material, wherein the modifying of the surface may include modifying (1004) a level of impurities trapped in the surface and a doping level of the surface. The method 1000 may further comprise forming (1006) charge carrier traps at the surface, wherein a capture rate and an emission rate of the charge carrier is influenced by an exposure to a light signal, wherein the exposure to the light signal may further change the doping level of the surface.

An embodiment herein provides an interface based approach that allows for the control of photocarrier trapping and doping in the 2D material. The selective doping at the contacts leads to significant changes in contact barrier properties and results in photoinduced doping. The large and controllable on-currents result in large photoresponsivities. Additionally, the nature of trapping and doping and the possibility of their selective area implemention, as presented in the embodiments herein, provides immense access to specialized device design. The embodiments herein can be used to improve upon conventional device concepts with enhanced properties, selectivity, and time response properties. These properties are important building blocks of many applications such as photo-detectors, sensors, and computing modules.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A device comprising:
   a substrate;
   an oxide layer grown on said substrate;
   a layer of self-assembled monolayers (SAMs) formed on said oxide layer; and
   a layer of two dimensional (2D) material applied to a surface of the layer of SAMs,
   wherein an interface of the 2D material layer and SAMs layer traps impurities and charge carriers, such that a capture rate and an emission rate of said trapped charge carriers are capable of being influenced by exposure to light to change a doping level of said interface.

2. The device of claim 1, further comprising two metal contacts, wherein said interface comprises a barrier height for injection of charge carriers into the layer of 2D material in a vicinity of the two metal contacts, and said SAMs modify the doping level near the interface.

3. The device of claim 1, wherein said interface is capable of changing the barrier height at the interface with the two metal contacts by being exposed to said light to change said barrier height in the vicinity of the two metal contacts which amplifies a current in said vicinity.

4. The device of claim 3, wherein said device is configured as any of a photo-detector, memory device, and a quantum computational device.

5. The device of claim 4, wherein said device is configured as a photo-detector having a responsivity greater than or equal to approximately $4.5 \times 10^3$ A/W at approximately 7 V.

6. The device of claim 1, wherein said substrate is formed of silicon oxide.

7. The device of claim 6, wherein the silicon oxide substrate having the SAMs layer formed thereon has a contact greater than or equal to approximately 65 degrees.

8. The device of claim 1, wherein said substrate comprises a pristine and approximately 300 nm thick thermally oxidized P-type Si substrate.

9. The device of claim 1, wherein the SAMs comprise thiol-based organosilanes.

10. The device of claim 9, wherein the thiol-based organosilanes comprise thiol-terminated (3-Mercaptopropyl) methyldimethoxysilane $(CH_3Si(OCH_3)_{2(c)}H_{2(c)}H_{2(c)}H_2SH)$.

11. The device of claim 1, wherein said 2D material comprises molybdenum disulfide.

12. The device of claim 2, wherein the two metal contacts comprise source and drain contacts connected to said 2D material layer.

13. The device of claim 12, wherein the source and drain contacts are approximately 3 nm to approximately 50 nm thick Ti/Au.

14. A method of forming a device comprising:
    growing an oxide layer grown on a substrate;
    forming a layer of self-assembled monolayers (SAMs) on said oxide layer; and
    applying a layer of two dimensional (2D) material to a surface of the layer of SAMs,
    wherein an interface of the 2D material layer and SAMs layer traps impurities and charge carriers such that a capture rate and an emission rate of said trapped charge carriers are capable of being influenced by exposure to light to change a doping level of said interface.

15. The method of claim 14, further comprising:
    treating the oxide layer with oxygen plasma for approximately 5 minutes to form hydroxyl on the oxide layer;
    applying an organosilane precursor to the treated oxide layer; and
    under vacuum conditions, allowing the self-assembled monolayers (SAMs) to form on the oxide layer with the applied organosilane precursor.

16. The method of claim 15, wherein the vacuum conditions are generated by a vacuum desiccator operated at pressure of approximately 5 mBar and a temperature of approximately 60° C. for approximately 2 hours.

17. The method of claim 14, further comprising:
    depositing a layer of 2D material on a film using chemical vapor deposition;
    releasing the deposited layer of 2D material from the film; and
    transferring the 2D material layer to the surface of the SAMs layer.

18. The method of claim 17, wherein a poly(methyl methacrylate) film is used for said depositing, a potassium hydroxide solution is used for said releasing, and an acetone solution is used for said transferring.

19. The method of claim 14, further comprising:
    forming source and drain metal contacts connected to said 2D material layer using e-beam evaporation at approximately $5 \times 10^{-6}$ Torr.

* * * * *